United States Patent [19]

Strasser et al.

[11] Patent Number: 5,415,729
[45] Date of Patent: May 16, 1995

[54] VACUUM TREATMENT APPARATUS

[75] Inventors: Gregor Strasser, Fürstentum, Liechtenstein; Pius Good, Mels; Jürg Steinmann, Walenstadt, both of Switzerland; Roman Schertler, Wolfurt, Austria

[73] Assignee: Balzers Aktiengesellschaft, Liechtenstein

[21] Appl. No.: 15,601

[22] Filed: Feb. 9, 1993

[30] Foreign Application Priority Data

Feb. 12, 1992 [CH] Switzerland .................. 419/92

[51] Int. Cl.⁶ ............................................ F16J 15/00
[52] U.S. Cl. ........................................ 216/67; 156/345; 118/733; 204/298.02; 204/298.35; 204/298.31
[58] Field of Search ................ 156/345, 643; 118/722, 118/723 R, 719, 733; 204/298.25, 298.35; 49/477.1; 34/242

[56] References Cited

U.S. PATENT DOCUMENTS

| 4,611,110 | 9/1986 | Astner et al. | 156/345 X |
| 4,735,421 | 4/1988 | Neef et al. | 277/1 |

FOREIGN PATENT DOCUMENTS 1199817 12/1959 France .
2152195 12/1983 United Kingdom .

OTHER PUBLICATIONS

Search Report in Swiss Application 419/92 filed Feb. 12, 1992.

Primary Examiner—Thi Dang
Attorney, Agent, or Firm—Notaro & Michalos

[57] ABSTRACT

A vacuum treatment apparatus which is used for the surface treatment of substrates or workpieces in a chamber, includes at least one pneumatically or hydraulically operated seal. The seal can be activated to close against a member for sealing off the chamber, particularly, after a substrate or workpiece has been transported into or removed from the chamber.

27 Claims, 15 Drawing Sheets

VACUUM TREATMENT APPARATUS

BACKGROUND OF THE INVENTION

1. Field of the Invention

The present invention relates to a vacuum treatment apparatus for a surface treating of substrates or workpieces. It also relates to a vacuum treatment apparatus having a valve for a sealed closing off of the apparatus. It relates further to a method of treating substrates or workpieces by means of a vacuum treatment apparatus. It relates also to a valve for a sealed separating and, furthermore, to a method of a sealed closing or separating, of a vacuum treatment plant or area portions thereof.

2. Description of the Prior Art

For the treatment of workpieces specific operating pressures are required in a vacuum chamber depending from the respective vacuum process to be performed. When workpieces are placed from the environment into the vacuum chamber, or from a treatment chamber into a different one, partition members which seal off must be foreseen. To this end, as is known, doors, valves or entire lock devices, resp. are foreseen.

When conducting a plurality of parallel treatment steps in vacuum processing apparatuses (e.g. multi-layer coatings) it is often necessary to separate the processing chambers from each other during the conducting of the processes. This is generally arrived at by a use of separating valves. In order to transport the substrates from one chamber into a subsequent chamber the separating valves are opened and the workpieces are advanced by one respective step by transporting units. These transporting units must have left the area of the opening of the valves before the closing or activating, resp. of the separating valves in order to allow a sealed separating of the respective process chambers. This leads firstly to a loss of precious time and secondly the transporting system must consist of a plurality of unit portions due to the problem of the penetration.

An attempt to solve this problem is described in the European specification EP-A-O 370 188 in that a transporting unit is suggested which considerably simplifies and accelerates the charging and the emptying of a process chamber. The basic principle consists in that the transporting device is formed of respective lever devices pivotally supported in the process chambers and which reach through the opened slot-shaped valves.

A further solution consists in that the article to be treated is introduced by a transporting mechanism in such a manner into the processing chamber that the chamber is closed off ,in a sealed manner by the mechanism itself and the movement in the direction towards the chamber such to allow the running of the process.

In a similar manner the European specification EP-A-O 244 950 describes a multiple-surface treatment apparatus for the treatment of planar articles, such as e.g. wafers, where these articles are transported on a moveable or rotatable, support between several operating stations in the apparatus. At the respective stations sealing means on the support are brought to engage corresponding sealing means at a treatment chamber in that congruent contours having seals and arranged at the support and at the treatment chamber contact each other and, therefore, can separate the chamber containing the respective substrate to be treated from the environment in a sealed manner.

Further variants of apparatuses for the treatment of substrates or the production, resp. of thin coatings are suggested in the German specifications DE 24 54 544, DE 26 09 115, DE 24 20 439, DE 40 09 603, DE 37 16 498, DE 37 35 284, DE 39 12 297, DE 39 12 295 and in the US-PS 3 874 525.

A vacuum treatment plant having a plurality of treatment stations is described in the DE-A-34 25 267, whereby a specially designed transport system is foreseen which includes a vertical and a horizontal transporting means. The isulation of the individual stations from the main chamber proceeds again in that sealing means are foreseen at a vertical transporting means, which separate the treatment chamber in a sealed manner when the substrate to be treated is introduced into the treatment chamber.

Common to all described apparatuses is that substrate supports or the substrates themselves are led or transported, by means of a transporting means into one or a plurality of treatment chambers in order to be surface treated at a vacuum in the one chamber or several chambers. Aside of these transporting means at least one further transporting or moving, mechanism is needed in order to cause a mutual engaging of sealing means in the treatment chamber or the one or several treatment chambers and corresponding sealing means, for instance at the substrate itself or at a support on which the substrate is transported, such that the chamber or the chambers can be closed in a sealed manner for the conducting of a treatment process. At the one side, such a contacting or engaging of the sealing means must be a precise fitting onto each other such to ensure a good seal, and additionally mentioned transporting or moving, means and mechanisms are sources of a possible contamination in these chambers, except when the various transporting mechanisms are separated by means of intrinsic bellows systems from the inside space of the apparatus or the chambers, in order to prevent contaminations.

SUMMARY OF THE INVENTION

Therefore, it is a general object of the present invention to provide a solution to close off a vacuum treatment apparatus or individual treatment chambers or portions of chambers of the apparatus in a sealed manner or to separate them in a sealed manner, whereby this has to proceed at minimal expenditures regarding mechanical movement devices in comparison with the valves used in accordance with the prior art in order to vastly simplify the corresponding design of the apparatus and to increase the economics thereof.

A further object is to solve at more complicated apparatuses having a plurality of treatment chambers problems which occur due to penetrations by a especially simplified movement of mechanics.

Still a further object of the present invention is to provide a vacuum treatment apparatus which comprises at least one pneumatically or hydraulically operable or activatable seal adapted to seal the apparatus and/or parts thereof.

The basic principle of the inventive vacuum treatment apparatus consists in that the sealing off of the apparatus or of one or several treatment chambers in the apparatus, proceeds by pneumatically or hydraulically operable or activatable, seals. The seals include a hollow core, i.e. they are designed in a hose, bellows or balloon like manner or are formed by a membrane-like arrangement. By an introducing or feeding, of a gas or a liquid into the core or the inside of this seal, or onto the reverse side of the membrane the surface of the seal or the membrane, is increased and/or moved by an expanding or a deflection of the bellows, such that the apparatus or parts thereof can be closed or separated in a sealed manner.

Therefore, these seals are to be manufactured from an elastic and/or expandable material, such as for instance of a natural or synthetic caoutchouc, or an elastic or flexible thermoplastic material or an elastomeric material. Spring elastic metal tubes or membranes and metal bellows, as well, are suitable, too. Latter can include at the sealing surfaces for an improved sealing effect an elastic plastic material or a rubber-like material.

The material of the seal to be selected must feature at the one side a sufficient strength, such that also in case of large differential pressures between an outer and an inner portion of the apparatus which is to separated in a sealed manner the respective seal is not urged away sideways, and at the other side the material must, depending from the treatment process to be executed, feature a high heat resistance and also be chemically resistant.

Depending from the respective treatment processes natural or synthetic caoutchouc is suitable as seal material, also plastic materials such as specifically elastomeric materials. Suitable materials can be found e.g. in the company catalogue No. 10/57 BE-40 186 of the Angst & Pfister Company, Zurich, Switzerland, on pages 7 to 20.

Such hydraulically or pneumatically, activatable seals are known in the art. They are described for instance by A. ROTH, VACUUM SEALING TECHNIQUES, PERGAMON PRESS, 1966, on pages 437 and 438 "inflatable rubber and steel pipe seals", for the sealed separating of various chambers. The subject is specifically the sealing of isolation areas at panes of glass which are to be evacuated. Also the company CEFIL'AIR offers in a company prospectus pneumatic seals in order to seal a chamber under pressure or vacuum. Although these seals as such are known, the art has until now not judged these seals to be suitable in the field of high vacuum techniques and, accordingly, they have not been used in this field.

The vacuum treatment chamber to be sealed by means of the inventively claimed seal can include one or a plurality of treatment chambers and/or a lock chamber, which each can be closed off or separated, by pneumatically or hydraulically activatable seals. It is, thereby, also possible to sealingly separate the apparatus or the individual chambers, in case that large cross-sections must be made available which exceed the magnitude of expansion of the respective seal by means of a gatelike, platelike or disklike valve, whereby a seal is arranged along the sealing contour of the gate, the plate or the disk at the valve in its or their closed state, which seal can be activated hydraulically or pneumatically. Thus, the gate, the plate or the disk of the valve can initially be closed, whereby, however, no sealing effect is arrived at along the contour to be sealed as yet. Instead of a further pressing on movement of the gate, the plate or the valve, for instance laterally relative to the closing movement in order to produce a complete sealing effect, the activatable sealing is activated during a further step and pressed against the sealing contour, wherewith the sealing process is completed.

The large advantage of the use of the hydraulically or pneumatically, activatable seals is that in order to generate a vacuum in a vacuum treatment apparatus it is possible to do away with at least one transporting or moving, mechanism wherewith the design of a vacuum treatment apparatus can be simplified considerably. In principle, only the moving or transporting, mechanism remains for feeding the substrates or workpieces to be treated into the apparatus and/or to transport them in the apparatus between the various treatment chambers. In case that gates, plates or disks are used in valves for the sealed separating of the apparatus or chambers, it is possible to do away with a pressing on movement in order to press the gate, the plate or the disk onto a seal.

A vacuum treatment apparatus suggested in accordance with the invention includes preferably one or a plurality of treatment stations and/or a lock chamber and also one or a plurality of chamber like recipients or containers which are open at least at one side, for the receipt of substrates or workpieces in the inside of the recipient or container. These recipients or containers, resp. are moved or exchanged, by means of a transporting mechanism between the individual treatment stations, whereby pneumatically or hydraulically activatable seals are foreseen at a part of or at all stations, such to sealingly separate or close the chamber-like recipients or containers, resp. in the respective position at a treatment station for the conducting of a treatment process.

Should it, for instance, be the case of a vacuum treatment apparatus for a treatment of planar substrates or workpieces, such as for instance of wafers and such as described in the EP-A-O 244 950, the chamber shaped recipients or the at the one side open containers could be of such a design that they have a only small hight, sufficient for the complete receipt of the planar substrate. In this case the transporting mechanism can be a transorting plate or a transporting web into which the recipients having a small depth or which are open at one side, are set.

The apparatus can include an outer and at least one inner apparatus area, whereby pneumatically or hydraulically activatable seals are foreseen at the outer and/or inner apparatus area in order to separate in a sealed manner the outer and/or inner apparatus area.

The outer apparatus area can include for instance a main chamber, a lock chamber or a distribution chamber, and the inner area one or a plurality of treatment chambers, whereby the substrates or workpieces, resp. to be coated are exchanged or transported by means of a transporting mechanism in the main chamber, the lock chamber and/or the distribution chamber between the various treatment chamber, whereby the treatment chambers are separatable in a sealed manner by means of hydraulically or pneumatically activatable seals against the main, the lock and/or the distribution chamber.

It is, furthermore, again possible to separate the individual chambers from the main, the lock or the distribution chamber by means of gate-, plate- or disklike valves, whereby the sealed separating proceeds by pneumatically or hydraulically, resp. activatable seals at the area of the sealing contour of the gate, the plate or the disk at the valve in its closed state, wherewith a pressing on movement can be done away with.

In order to treat disk shaped or planar articles, such as wafers, an apparatus is, furthermore, proposed in which planar transporting supports are foreseen in order to move the articles between a plurality of treatment stations, whereby hydraulically or pneumatically activatable seals are foreseen in the area of a part of or of all the treatment stations and directed towards the planar transporting support, of which seals the distance of their expansion or stroke, resp. in the direction towards the transporting support is such, that if the seal is in its retracted state the disk shaped articles can be freely moved into or out of the treatment station, whereby, however a sealed separating of the treatment station is ensured during the executing of the treatment process by an activating of the seal in a direction towards the transporting support.

In order to for instance increase the sealing effect of a valve, it is proposed to operate in parallel a plurality of pneumatically or hydraulically activatable seals, whereby it is possible to additionally pump the intermediate space between two parallel arranged seals off in a differential manner. By means of this it is additionally possible to prevent a so called virtual leak of the seal for an increase of the sealing effect in that a defined state can be obtained in the intermediate space between the two parallel seals by an additional evacuating. By an arranging of several parallel seals it is, however, also possible to reduce the loading of the individual seals.

It can be, furthermore, advantageous to protect the individual hydraulically or pneumatically activatable seals against possible influences inside of a treatment chamber by a placing of screens, labyrinths or blinds such to at least partly shade or protect, resp. the seals. This is specifically necessary if coating or etching, resp. treatments of substrates are made, whereby the coating medium may deposit on the surface of the seal or an etching medium which is used may attack the surface of the seal.

The inventively described vacuum treatment apparatuses are suitable for practicing any kind of surface treatment methods on substrates or workpieces, resp. The apparatusses are specifically suitable for the practicing of PVD, CVD or other plasma methods, or also for the conducting of etching or any kind of other coating processes.

A further object is to provide a method for a sealed closing or separating, resp. of a vacuum treatment plant for a surface treating of substrates or workpieces, in that one or a plurality of hydraulically or pneumatically activatable seals are activated by an infeeding of gas or liquid into the inside of the seal in such a manner that their surface is increased in such a manner that openings communicating between the inside area of the apparatus or area portions thereof and the respective environment are closed in a sealed manner.

Yet a further object is to provide a method for a sealed closing or separating, resp. of a plurality of treatment stations in a vacuum treatment plant for a conducting of separated treatment processes on substrates or workpieces in that hydraulically or pneumatically activatable seals are foreseen at least at a part of the stations.

These seals are activated during the conducting of the treatments in order to sealingly close the respective station, and are deactivated or pulled back, resp. in order to allow a moving of the substrates or workpieces, resp. between the stations.

The present invention has as further object a solving of the problem of the separation of a plurality of treatment chambers in a vacuum treatment plant, in that the advantage of a complete vacuum separation of the individual chambers at a simultaneous solving of the initially mentioned movement or transport, resp. problem when moving the substrates into the various treatment chambers and of the sealed closing of the individual chambers or area portions, resp. of the apparatus is exploited.

Thus, it is possible in accordance with the invention to close the gap between the respective wall of the treatment chamber and a transporting means in or on which the substrate or workpiece to be treated is transported by means of mentioned pneumatically or hydraulically activatable seals in such a manner that the separated treatment chambers are produced. However, the materials which are to be selected for the seals are subjected, due to the field of application, namely in a vacuum environment, specifically at pressures less than $10^{-3}$ mbar, to much more severe demands than for a general application at atmospheric conditions or when used at a range of a minor vacuum. The seals to be selected must feature in this case a low gas discharge and permeation rate, which is reached for instance by using the various above mentioned polymeric materials, such as for instance a fluor elastomeric.

Furthermore, the surface must have no irregularities or defects, such that a low rate of leakage at the separation of the various treatment chambers or the apparatus itself is achieved.

In such cases where less high demands are made regarding the vacuum separation, quite obviously less stringer demands regarding the quality of the seal are posed. In certain more simple cases even diffusion gap like conditions may be allowed which still more facilitates considerably the application of the seal.

For the closing and re-opening of the apparatus or of area portions thereof and/or of individual treatment stations it is possible, such as mentioned above, to achieve the sealing by gates, plates or disks at valves. In order to close the respective area off the respective gate, plate or disk of the valve is closed by a translatoric movement and thereafter, instead of a pressing-on movement, a hydraulically or pneumatically activatable seal along the closing contour of the gate, the plate or the disk of the valve is operated in such a manner that a completely sealed closure or a sealed separation, resp. is arrived at by the respective contour. In this way the valve can be designed in such a manner that the gate, the plate or the disk or a door, resp. located in such valve can be moved without any side friction, because no complete sealing must be obtained by mentioned translatoric movement. Therefore, a small gap can be present at the so-called sealing contour at the opening and closing, resp. of the valve, which thereafter is sealingly bridged by the hydraulically or pneumatically activatable seal. Mentioned kind of functioning is also advantageously applicable at walls of locks.

All the above mentioned, various inventive vacuum treatment plants, applications and methods can quite obviously be transferred to and used in all apparatuses designed in accordance with the prior art.

Therefore, the European Patent Applications EP-A-370 188, 343 530 and 244 950 are specifically to be mentioned, wherewith the transferring of the inventive idea of the using of hydraulically or pneumatically activatable seals onto the three mentioned European Patent Applications forms herewith an integral part of the present invention.

BRIEF DESCRIPTION OF THE DRAWINGS

The present invention will be better understood and objects other than those set forth above will became apparent when consideration is given to the following detailed description thereof. Such description makes reference to the annexed drawings, wherein.

DETAILED DESCRIPTION OF THE PREFERRED EMBODIMENTS

Figure 1A:
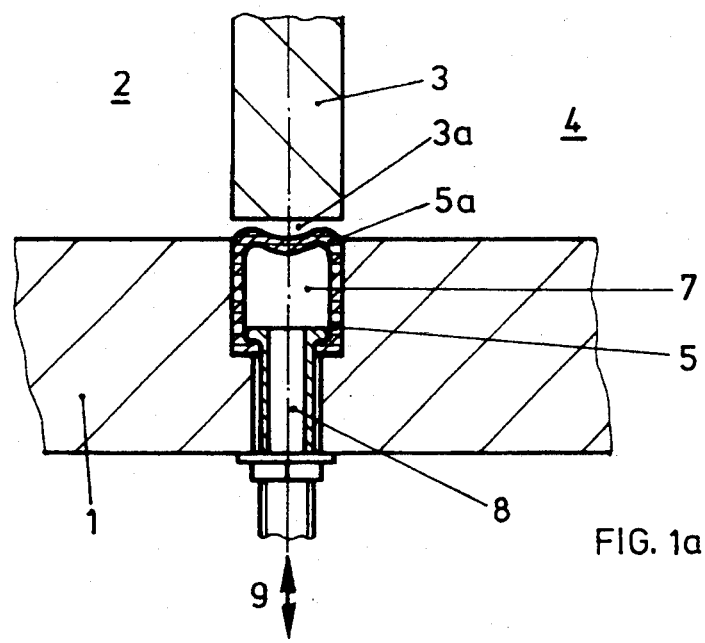
FIGS. 1a and 1b illustrate the inventive basic principle of the activating and deactivating of a pneumatically or hydraulically, resp. activatable seal, based on schematic sketches.
Figure 1B:
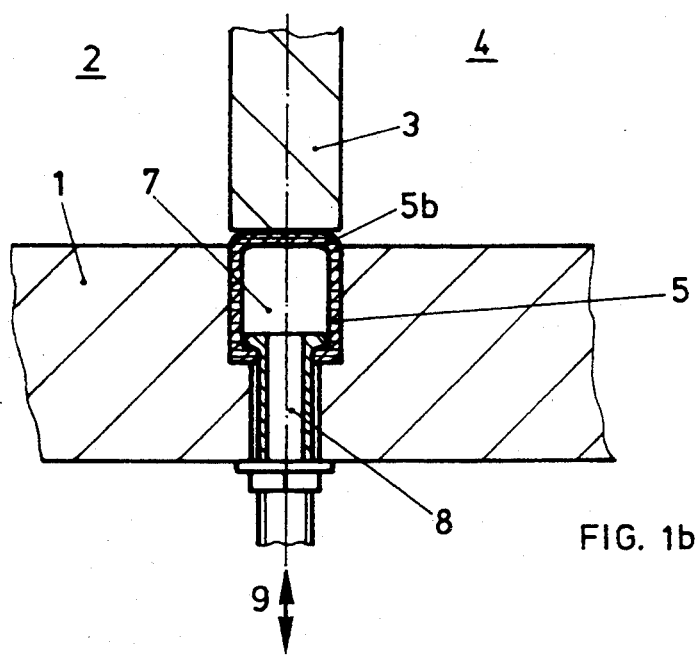

With reference to FIGS. 1a and 1b, the basic principle of the application of a hydraulically or pneumatically activatable seal will now be described.

FIG. 1a illustrates in section a partial area of an outer wall 1 of a vacuum treatment apparatus, and a partition 3 between two area portions 2 and 4 inside of the apparatus, as well. The partition 3 does thereby not contact the outer wall 1 in a sealed manner but rather leaves a gap 3a open, such that the partition 3 can be arranged freely movable relative to the wall 1. A seal 5 is set into the outer wall 1, having an upper contour 5a which faces the gap 3a. The seal 5 includes a hollow core 7 which is connected via a conduit 8 to a pneumatic or hydraulic system 9.

In FIG. 1a the seal 5 is thereby deactivated or retracted, resp. and the gap 3a is open.

In order to sealingly close the two area portions 2 and 4 off, the seal 5 is now activated in that a gas or liquid is pressed through the conduit 8 into the inner hollow space of the seal 5. Now, the upper contour 5b of the seal 5 is pressed against the partition 3, wherewith both area portions 2 and 4 are separated from each other in a sealed manner such as visible in FIG. 1b. Thus, it is for instance possible to evacuate the area portion 2 and to conduct a treatment process therein which is to run separated from the area portion 4.

When now the treatment process is terminated, the seal 5 can be deactivated wherewith the upper contour 5a is again retracted into the position of FIG. 1a, and the partition can be for instance moved in the one or the other.

Figure 1C:
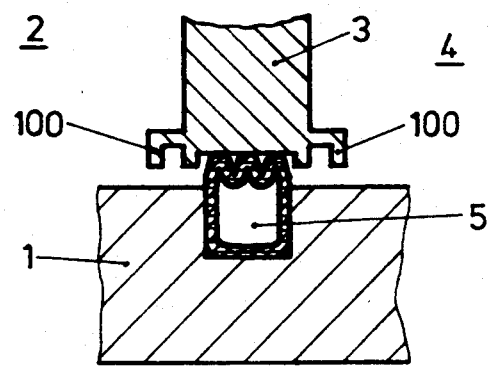
FIG. 1c illustrates the placing of lateral blinds for the protection of the seal.

FIG. 1c illustrates again in section a seal 5, analogue to the two FIGS. 1a and 1b, which seal is pressed onto the partition 3 in a sealed manner in order to separate the two area portions from each other. In order now to protect the free surface of the seal 5 exposed to the treatment chamber 4 against possible influences in the chamber 4, such as for instance protection against a coating medium, protection against possible etching substances, a protection screening 100 is foreseen advantageously in order to shade mentioned surface of the seal. In place of the illustrated screening 100 quite obviously a blind, a labyrinth or any other suitable means may be foreseen in order to protect the seal 5.

FIGS. 1d to 1k illustrate further embodiments of the pneumatically or hydraulically, resp. activatable seals.

Figure 1D:
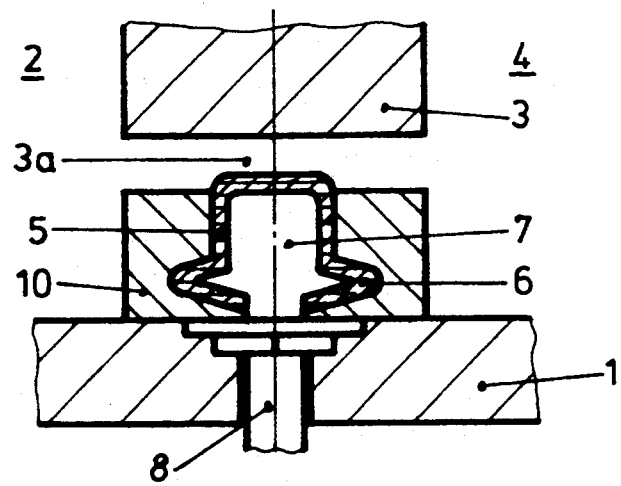
FIGS. 1d–1j illustrate further preferred embodiments of pneumatically or hydraulically activatable seals.
Figure 1E:
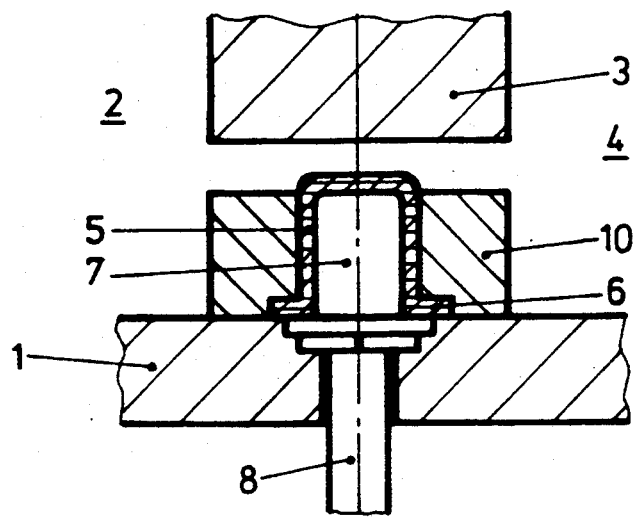

In FIGS. 1d and 1e guides 10 are located at the sides of the hydraulically or pneumatically, resp. and expansible seal 5 in order to ensure a directed expanding movement of the seal 5 in case of the activating. Additionally, the seal 5 is held by cam-like or bead-shaped members 6 in corresponding recesses in the guides 10. Otherwise, the functioning proceeds analogue to that of the seals which are illustrated in FIGS. 1a and 1b, resp. Seals in accordance with the embodiments according to FIGS. 1a and 1e are used in such a case where the seals shall for instance and not such as the seals in FIGS. 1a and 1b, resp. be set into the support. This, if the seals shall be for instance easyly montable and removable onto and from the support in order to exchange them, and are not to be inserted, set into the support as in the case of the seals according to FIGS. 1a and 1b, resp. The guide ledges 10 can for instance be bolted on.

Figure 1F:
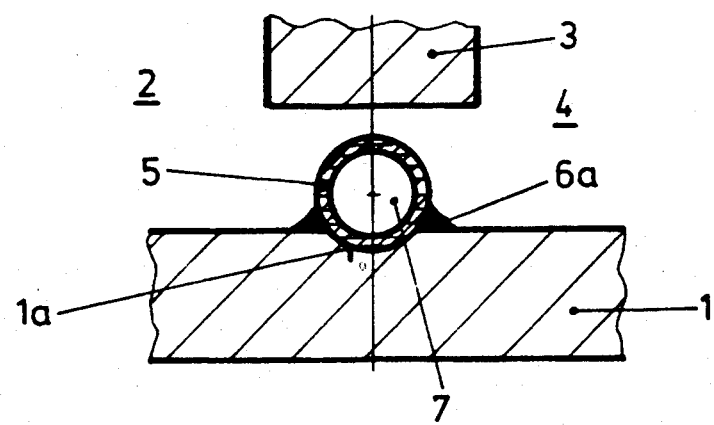

FIG. 1f illustrates a hose shaped seal which for instance is inserted into a recess 1a of the outer wall 1. In order to prevent a lateral slipping or lifting off, resp. of the hose shaped seal 5 from the wall 1, it can be fixed for instance by a bonding material on the wall, or can be vulcanized directly onto the wall 1 by use of a rubber like material.

Figure 1G:
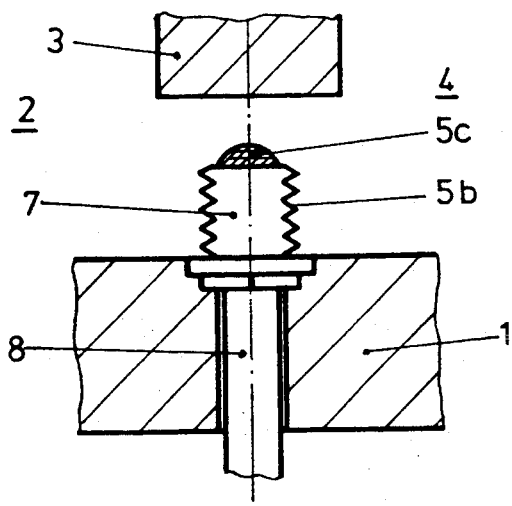
Figure 1H:
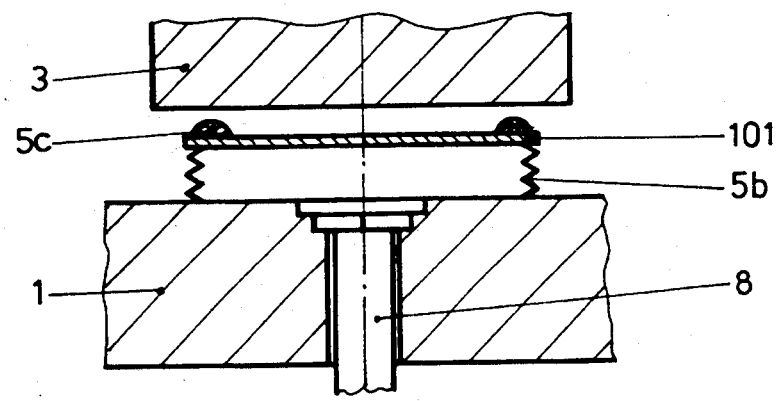
Figure 1I:
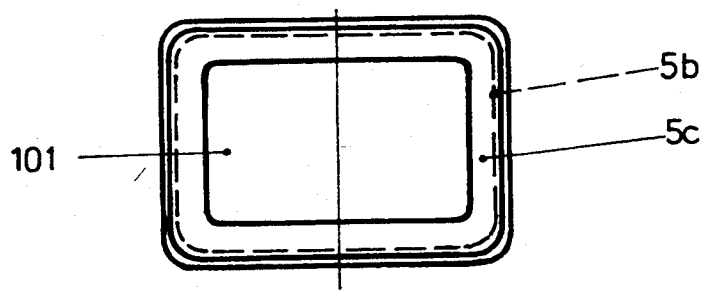
Figure 1J:
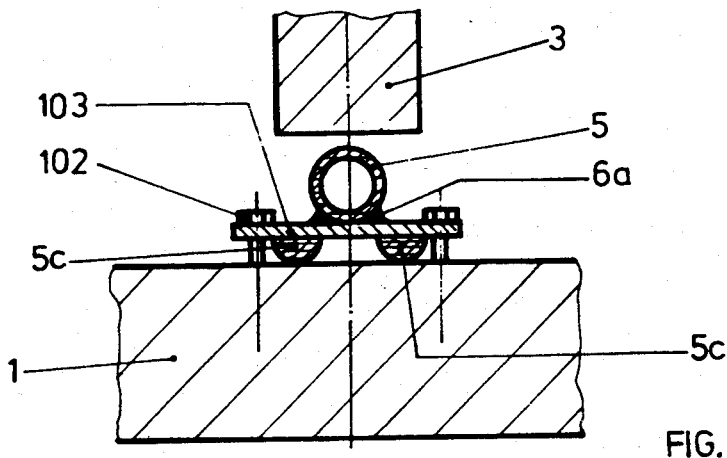

FIGS. 1g to 1i illustrate on an exemplary basis bellows like seals, including for instance a metal bellows 5b. The advantage of the use of a metal bellows 5b is that it is possible to bridge by means of an inventive seal 5 considerably larger intermediate spaces to be sealed, and additionally, the seal itself is considerably stronger. This allows at a structural design of parts to be sealed, such as valve arrangements, doors, locks, parts of apparatuses which are to be sealed substantially more possibilities. The members 1,3 to be sealed, such as members of apparatuses or devices, resp. such as valve plates, parts of walls and others must often be moved relative to each other without rubbing at the retracted seal. In order to ensure at the front side of the bellows a good sealing against the partition 3, preferably a suitable sealing metal or a suitable polymeric material, such as Teflon or an elastomeric material is preferably located at the front side of the bellows, which material, upon an activating of the bellows 5b is pressed onto the partition 3 and seals, thereafter.

In FIGS. 1h and 1i the metal bellows 5b carries at its front side a planar, covering member or a plate, resp. or a frame 101, which either can be made of a plastic material, or, however, can also consist of metal. In order to again ensure a good sealing relative to the member 3 the plate 101 is preferably covered by an elastic material 5c, at least at its periperal area.

FIG. 1h illustrates the inventive sealing arrangement in section, while FIG. 1i is a top view of the arrangement, in which specifically the at all sides peripheral elastic seal 5c can be recognized which coveres the plate 101. By use of the metal bellows 5b it is possible to use plates 101 of relatively large surface areas wherewith a sealing of large areas is made possible, also in case of large interstices to be bridged.

Finally, FIG. 1j illustrates again a hose-like seal 5 which is arranged on a supporting plate 103. Again, the hose shaped seal 5 can be vulcanized directly onto the plate or be placed on the plate by means of a bonding agent 6a. The supporting plate 103 is arranged by means of mounting members 102, e.g. by means of threaded bolts at the outer wall 1, whereby the sealing can be obtained via sealing beads 5c consisting for instance of an elastomeric or rubber like material. FIG. 1k allows a specifically simple mounting and exchanging of the seal in case it must be exchanged due to wear. Due to the setting on a support, such as a supporting frame or a plate this unit with seal can be handled as a component which is important regarding the commercial utilisation. Furthermore, there is the possibility of placing as required different seals in that the supporting plates 103 can be changed any time.

Figure 2A:
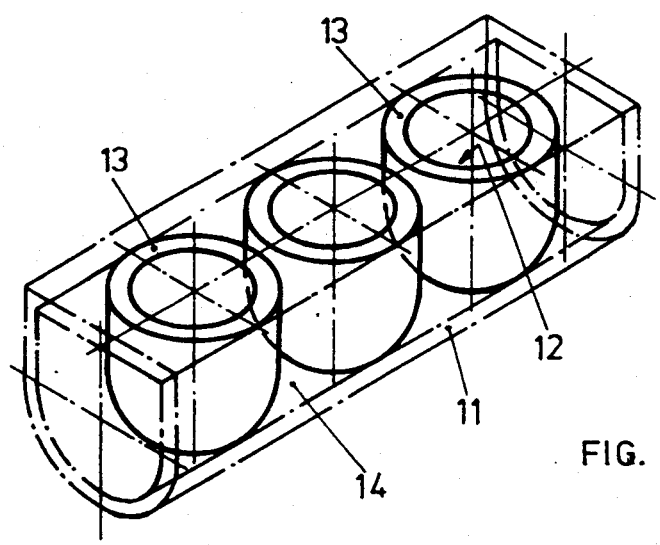
FIGS. 2a, 2b and 2c illustrate a possible embodiment of a vacuum treatment apparatus structured in accordance with the invention and on a schematic basis, designed in longitudinal and cross-section.
Figure 2B:
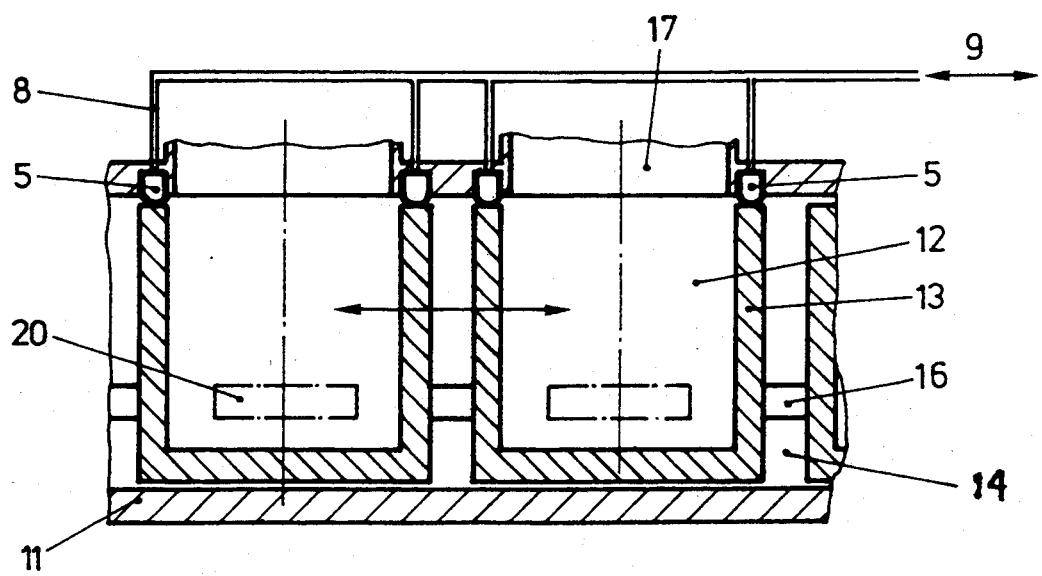
Figure 2C:
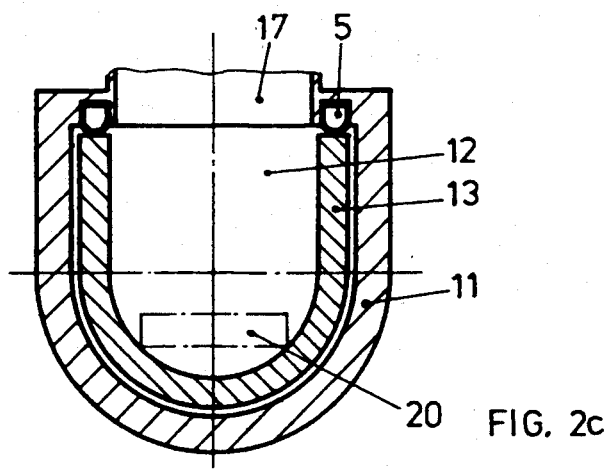

In FIGS. 2a to 2c an example of a possible inventive vacuum treatment apparatus is illustrated, including three different treatment areas, whereby a substrate 20 to be treated is located in the inner space 12 of a chamber like recipient 13. The chamber like recipient 13 is arranged for longitudinal movement in a vacuum treatment apparatus 11, and specifically between three different treatment stations.

In order to conduct a treatment process of the substrate 20 at a treatment station 17 the chamber like recipient is moved by means of a transporting system 16 to the respective position, whereafter the seals 5 are activated by means of a gas fed thereto through the conduit system 8 or by a liquid. Due to the inflating of the seals 5 they will contact the upper edge of the chamber like recipient 13, such that now the inner space 12 of the chamber 13 is closed off or separated, resp. in a sealed manner against or from, resp. the inner space 14 of the apparatus 11. The chamber elements 13 can be designed in various shapes depending from the size of the substrates and the desired distances from the treatment devices or dependent, resp. from the desired treatment settings. Thus, instead of the relatively deep chamber 13 illustrated in the FIGS. 3a to 3c, a planar, flat plate may be foreseen having a small shaped recess in which for instance a planar substrate, such as a wafer finds place easyly. Thus, it is for instance also possible to design the transporting system in such a manner that a chamber having a corresponding depth magnitude for the receipt of a substrate can be foreseen in the transporting system itself.

Now, the inner space 12 of the chamber 13 can be set to the desired process conditions and the process treatment can be carried out. Simultaneously it is possible, for instance if the chamber 11 of the apparatus is designed as intermediate chamber, to charge or introduce, resp. a new chamber 13 without disturbing the treatment. It is also possible to run a plurality of treatment processes and/or changing procedures side by side and as desired not coupled to each other. After termination of the treatment the seals 5 are again deactivated and the chamber 13 is moved to a further treatment station.

FIG. 2b illustrates a longitudinal section through the apparatus 11 of FIG. 2a, while FIG. 2c illustrates a corresponding cross-section through the apparatus and the chamber like recipient 13.

Figure 3A:
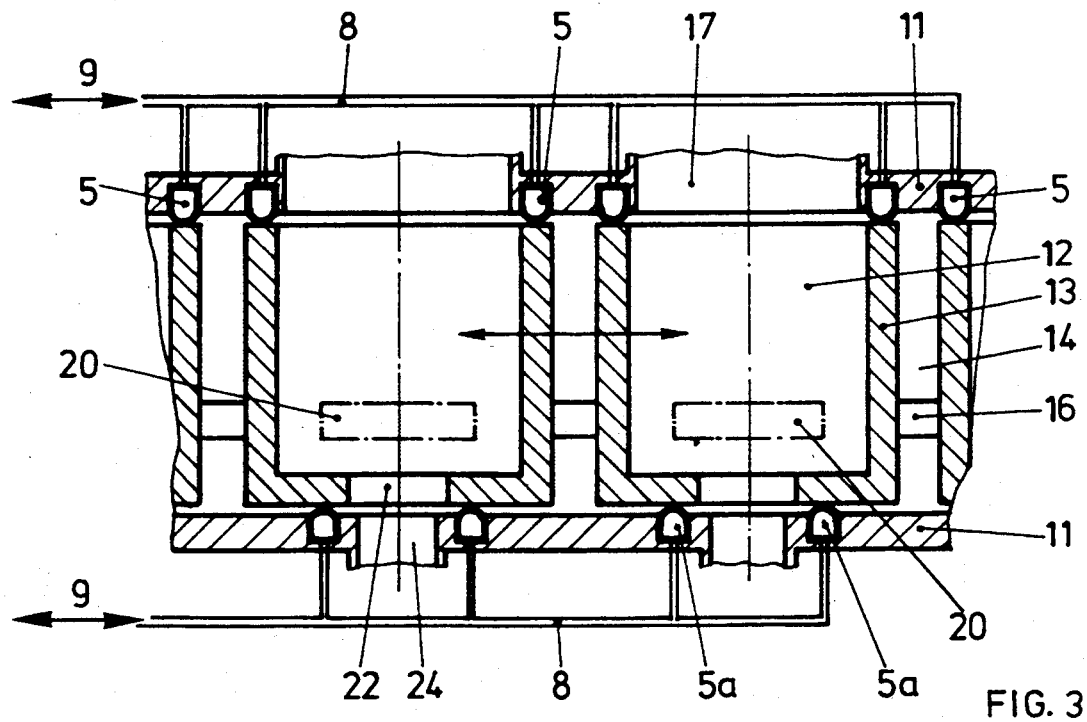
FIGS. 3a and 3b illustrate a further embodiment of a vacuum treatment apparatus structured in accordance with the invention, designed in longitudinal and cross-section.
Figure 3B:
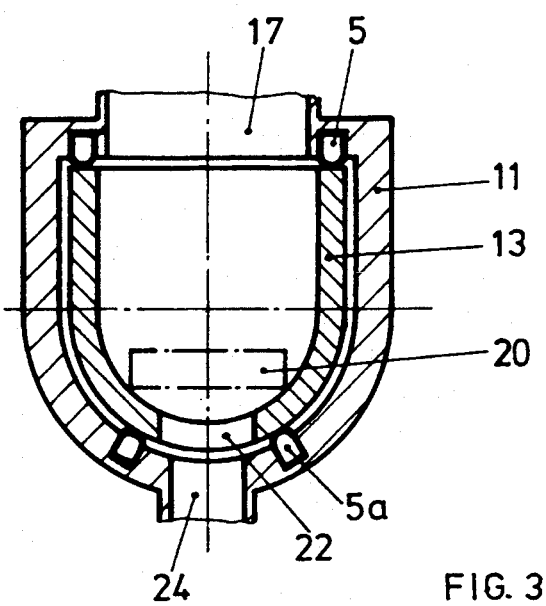

A similar apparatus 11 is illustrated in the FIGS. 3a and 3b, whereby, however, additionally the chamber like recipient 13 includes an opening 22 at its lower area, for instance in order to couple the inner space 12 of the recipient 13 to a vacuum pump 24, or to provide an access for manipulators, measuring devices or also additional treatment possibilities. In order to allow the inner space 12 of the chamber 13 at a treatment station 17 to be closed off in a sealed manner relative to the inner space 14 of the apparatus 11, it is necessary to arrange additionally seals 5a at both sides of the additional opening 22 which seals 5a again are activated via conduits 8 by a pneumatic or hydraulic system 9. In accordance with the invention it is also possible to realize a plurality of such openings.

For the conducting of the treatment process for the treatment of the substrate 20 at a station 17 again the inner space 12 of the recipient 13 is evacuated, whereby in the illustrated example the evacuating proceeds oppositely to the treatment arrangement proper.

Figure 4A:
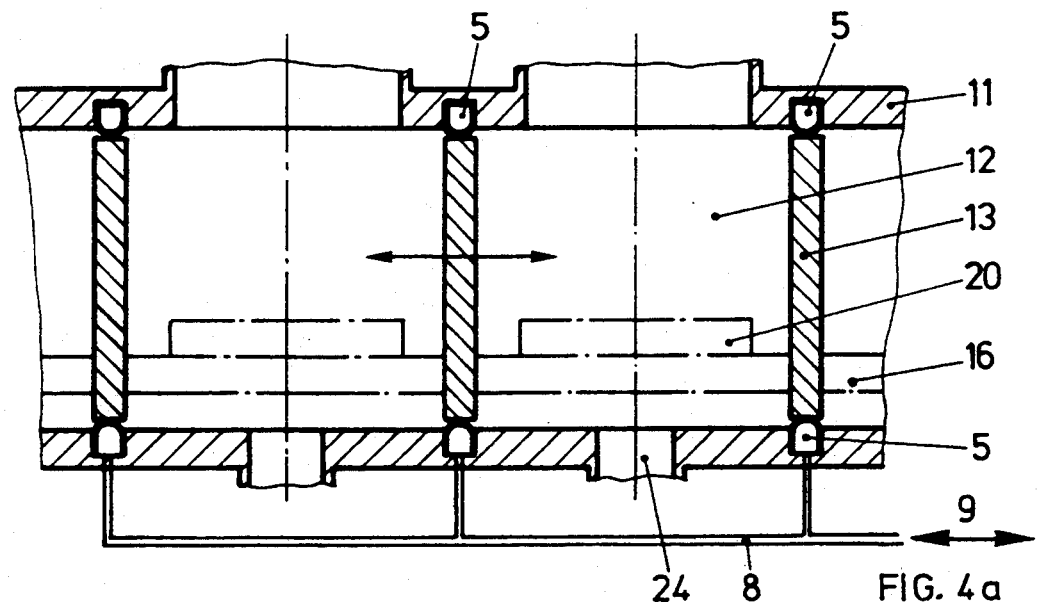
FIGS. 4a and 4b illustrate yet a further vacuum treatment apparatus, in a longitudinal section and a section viewed from above.
Figure 4B:
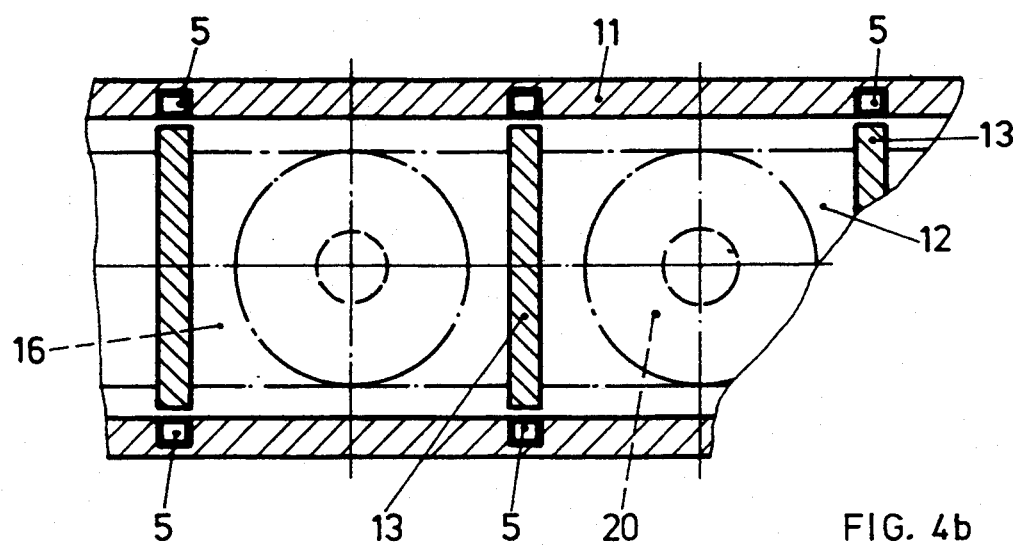
Figure 4C:
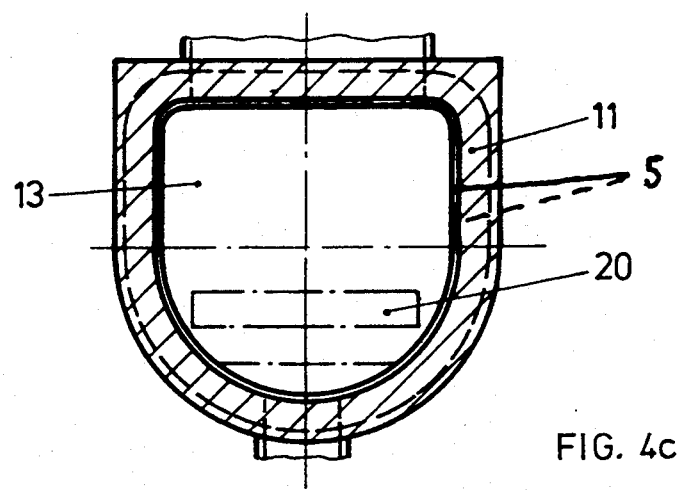
FIG. 4c illustrates the cross-section.

FIGS. 4a, 4b and 4c illustrate again a further embodiment of an inventive vacuum treatment apparatus, whereby FIG. 4a is a longitudinal section seen from the side, FIG. 4b is a longitudinal section seen from above and FIG. 4c is a cross-section of the apparatus. According to the embodiment of FIGS. 4a, 4b and 4c the chamber like recipient is designed in such a manner that it includes now only transversly extending partitions 13 as interconnected transporting unit in the longitudinal direction, connected via connectors 16. In FIG. 4 the outer wall of the chamber is designed as channel shaped member 11 whereby the seals 5 and the partitions 13 form separate chambers. This kind of function can also be applied if an axially symmetrical chamber is used instead of the channel shaped element, in which partitions are arranged rotatably in a sealed manner around a central axis. The seals 5 can be activated via conduits 8 from a hydraulic or pneumatic, resp. system 9.

Such as already mentioned with reference to FIGS. 2a to 2c, it is possible in case of thin or planar substrates such as for instance wafers, to have a corresponding chamber or recipient, resp. formed as a depression or recess in the transporting system 16 such that in this case the partition 13 are not needed. When the substrates are extremely thin, the gap which has to be negotiated during the transporting of the substrate or the opening from the one chamber to the next chamber, resp. is to such an extent tiny that it can be bridged only by means of the hydraulically or pneumatically activatable seal 5. Thus, the need for a partition 13 does no longer exist such as mentioned. In this case, the transporting plate 16 is sealed directly. In an analogue manner, a rotating plate 16 is foreseen in the above mentioned axially symmetrical chamber, which rotating plate or rotating transport plate 16, resp. includes recipients or chambers of a small depth formed correspondingly therein in case the substrates are planar. Again, mentioned transport plate 16 is sealed directly.

The basic principle of the apparatus corresponds to the one of FIGS. 2a to 2c or 3a or 3b, resp.

Figure 5:
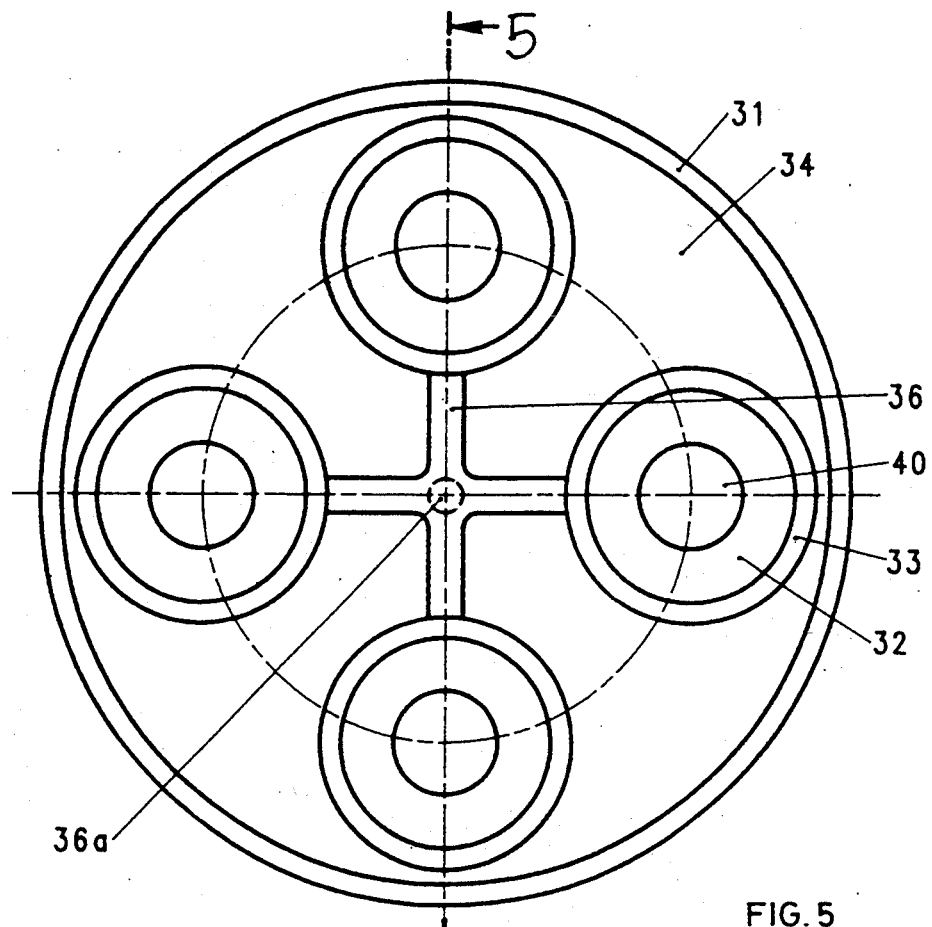
FIG. 5 illustrates a vacuum multi-treatment apparatus, having four treatment stations separated from each other, in sections as viewed from above.
Figure 6:
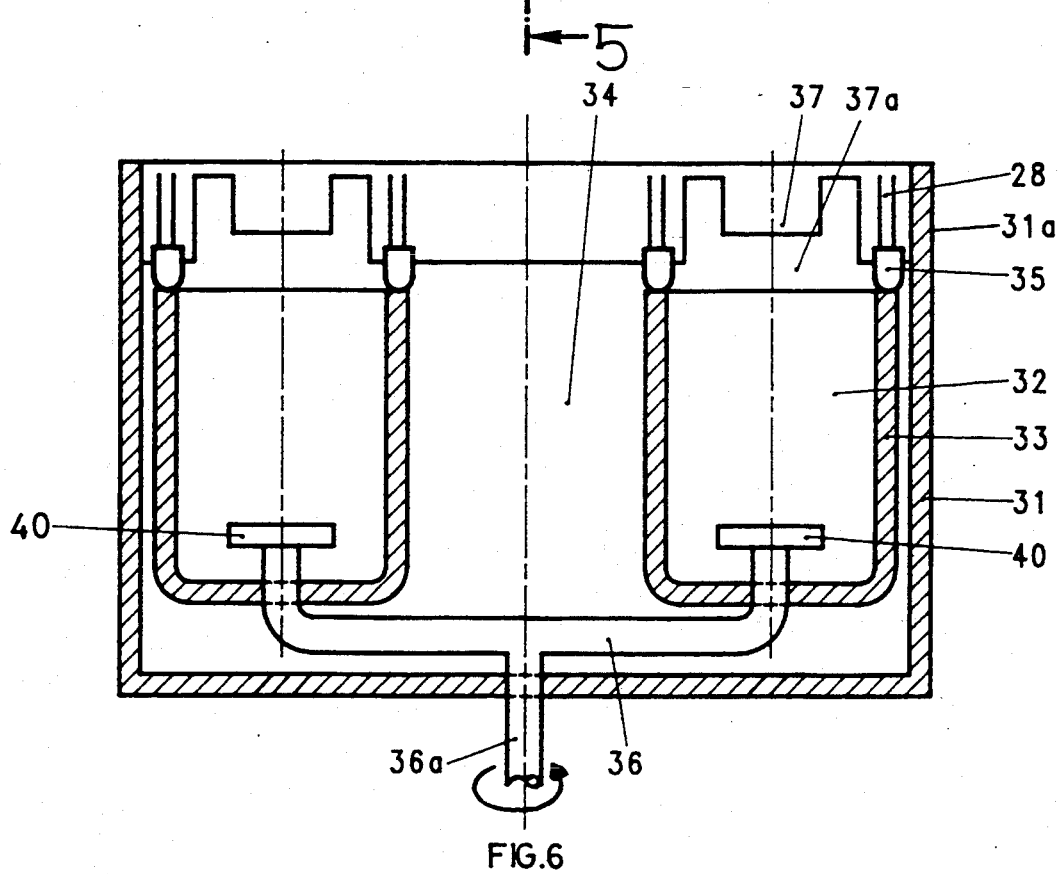
FIG. 6 illustrates the apparatus of FIG. 5 in section along line 5—5.

FIGS. 5 and 6 illustrate, in contrast to the previous examples, schematically a vacuum treatment plant as a rotating circulating arrangement in which four treatment processes can be conducted separate from each other.

FIG. 5, thereby, illustrates the apparatus as seen from above, whereby the treatment units proper are removed from the individual stations such that the view into the inner space of the apparatus is not obstructed.

FIG. 6 illustrates the same apparatus in section along the line 5—5.

Inside an outer chamber 31 of the apparatus four chamber like recipients 33 are located on a rotatable transporting cross 36, each encasing in the inside 32 a substrate 40 to be treated. Four different treatment units 37 for the conducting of for instance coating or etching processes on the substrate 40 are located in the cover or top, resp. area 31a of the vacuum apparatus. In order to separate the respective four treatment chambers 37a from the intermediate chamber 34 of the apparatus 31, pneumatically or hydraulically activatable seals 35 are foreseen which allow a sealed closing at the upper edge of the recipient 33. In order to run the treatments these seals 35 are now activated and the inner space 37a of the respective process chamber is evacuated by suitable means whereby for sake of clarity these means are not illustrated.

Now, the treatment of the substrate 40 by means of the respective treatment units 37 is made, whereby no contamination through the inner space 34 of the apparatus 31 or from other treatment chambers is possible. After ending the respective processes the seals 35 are deactivated and the four chambers are rotated by the rotation system 36 by 90°. Now a further treatment of the substrates 40 is made.

Obviously, the vacuum treatment plant illustrated in FIGS. 5 and 6 is designed schematically and very simplified and can be completed by mounting a charging or discharging, resp. lock arrangement. Thus, one of the process positions can be foreseen directly as lock arrangement in order to feed substrates from the environment into the apparatus.

It is also possible to foresee further treatment stations and to design the individual recipients illustrated analogue to the recipients of FIGS. 2 to 4 differently. Also, it is possible without any further ado to use for planar substrates in place of the chambers and of the rotating system 36 one single rotating plate having small recesses as recipients for substrates.

Figure 7B:
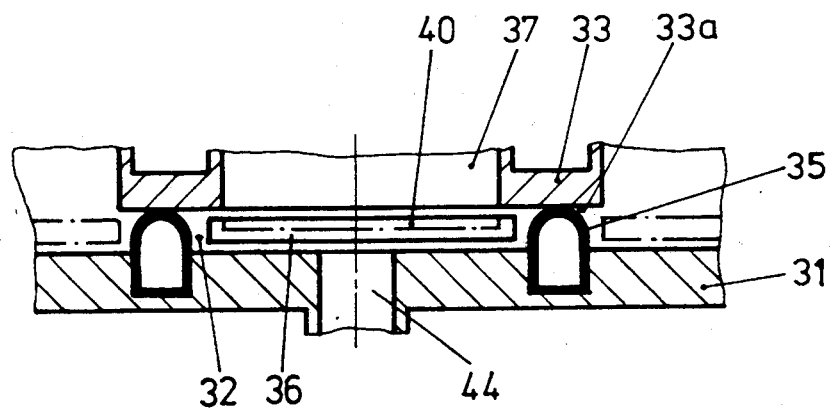
FIGS. 7a and 7b illustrate a further embodiment of a treatment chamber of an inventive vacuum treatment apparatus for planar substrates, in section viewed from above and in cross-section.
Figure 7A:
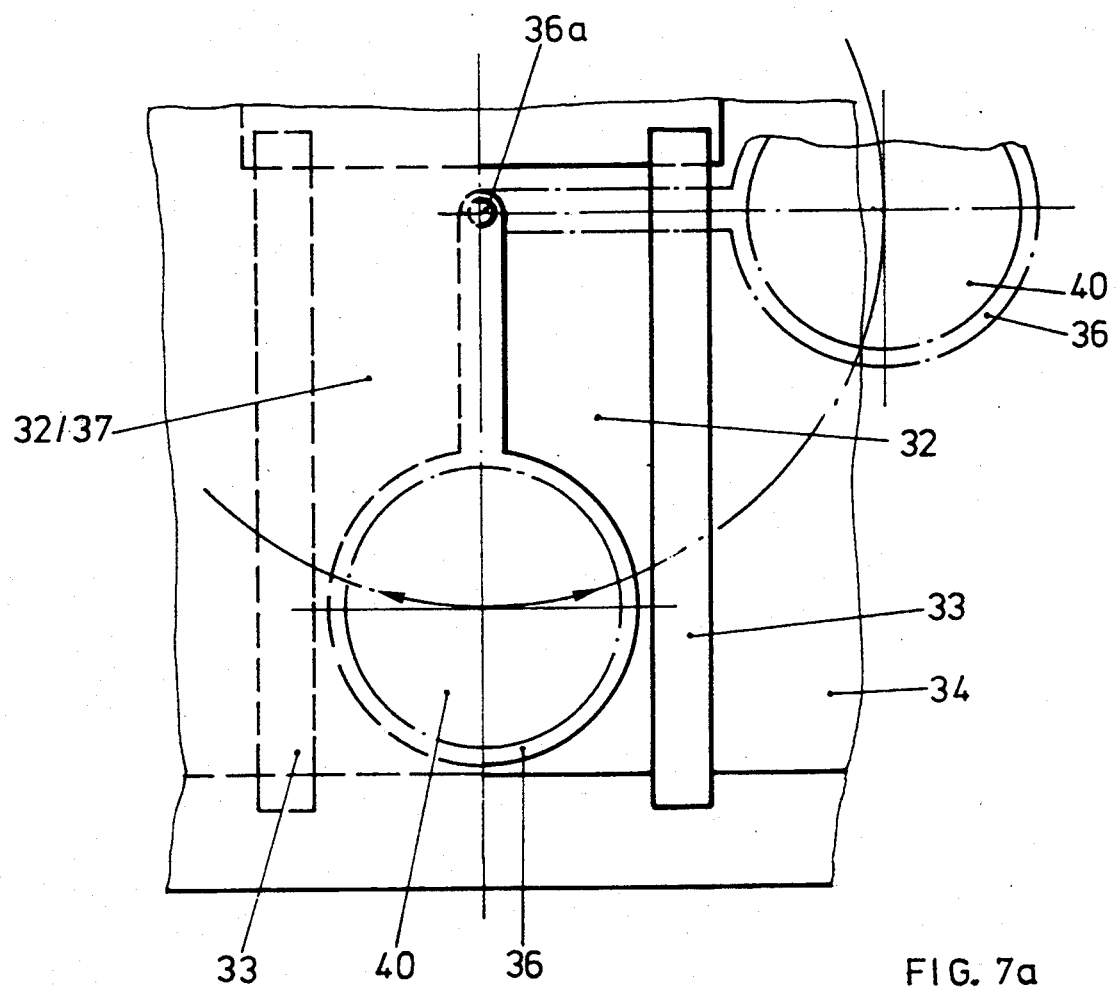

FIGS. 7a and 7b illustrate a further arrangement, suitable for the use of hydraulically or pneumatically, resp. activatable seals. These are specifically suitable for the coating of planar or disk shaped, resp. substrates, for the surface treatment of which it is not absolutely necessary to foresee in a vacuum treatment apparatus a freely movable recipient or open container, resp., into which the substrate to be treated is to be placed.

FIG. 7a illustrates in a top view a treatment chamber 32 arranged stationary in an apparatus 31, including lateral border walls 33 arranged in a stationary manner. A lever like transporting support 36 which is pivotable around an axis 36a is located in the treatment chamber 32. The pivoting movement proceeds through a gap 33a which such as can be seen in FIG. 7b is formed under the lateral bordering wall 33.

It also can be seen in FIG. 7b that this gap 33a may be closed by means of a pneumatically or hydraulically activatable seal 35.

In order to charge the planar or disk shaped substrate 40 to be treated the transporting device 36a is pivoted through the gap 33a towards the outside in order to receive the substrate. Thereafter, the pivoting movement around the axis 36a into the treatment chamber occurs. Now, the two seals 35 are activated whereafter the gap 33a is closed in a sealed manner. Thereafter, it is possible to treat or coat, resp. the planar substrate 40 in the treatment chamber 37 by means of a treating unit. Instead of pivotable transporting devices it obviously is possible to use any kind of translatoric transporting devices which are of a planar design.

Figure 8:
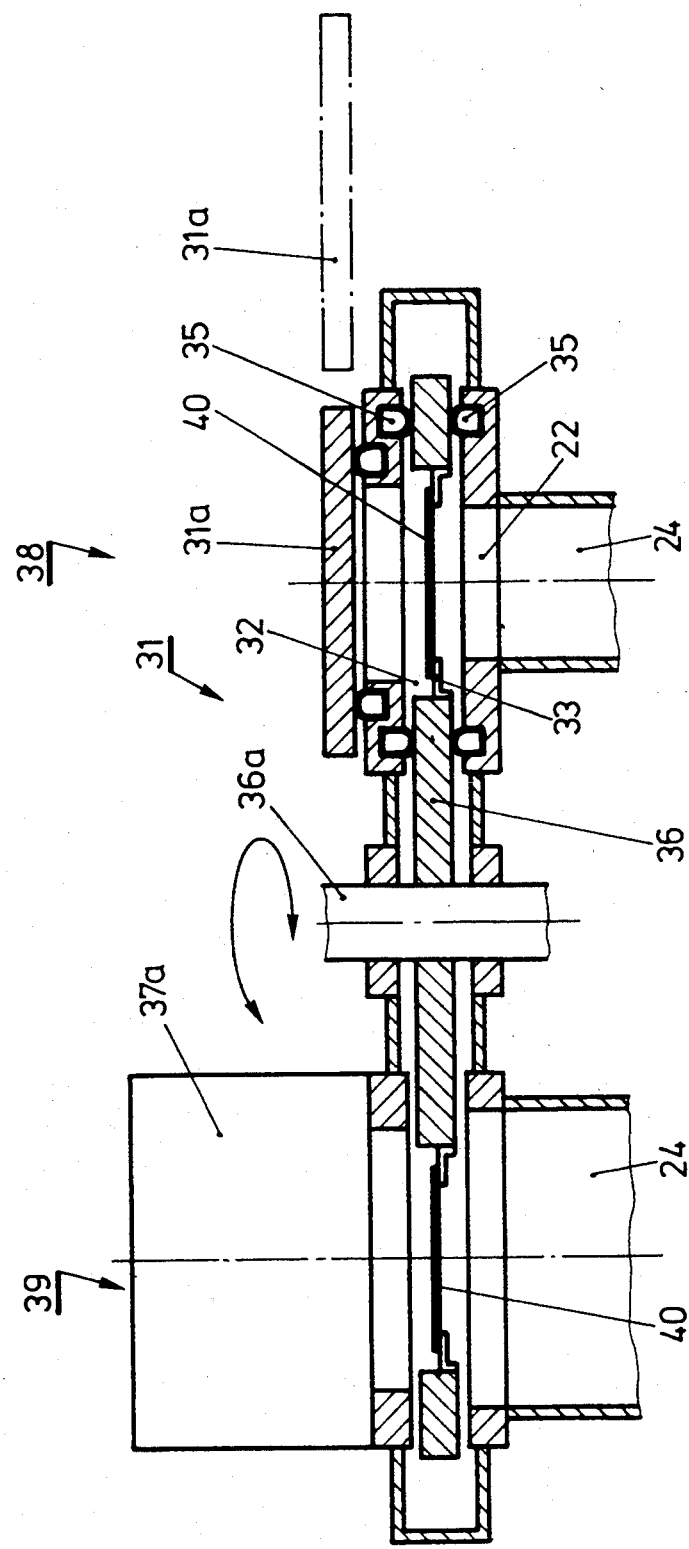
FIG. 8 illustrates a further treatment apparatus for the treating or coating, resp. of planar substrates, similar to the apparatus illustrated in FIGS. 5 and 6 in cross-section.

FIG. 8 illustrates analogue to FIG. 7 a vacuum treatment plant for a treating of planar or disk shaped, resp. substrates, whereby analogue to the illustration of FIGS. 5 and 6 the planar substrate or substrates 40 to be treated are rotated on a transporting mechanism 36 around a rotation axis 36a between a plurality of stations. Here it can be, such as in FIGS. 5 and 6 a multiple treatment apparatus or, however, a vacuum treatment apparatus having a lock chamber 38 and a vacuum processing chamber 39. The apparatus is illustrated in FIG. 8 in cross-section, analogue to FIG. 6, because a corresponding top view of this apparatus corresponds roughly to the view of FIG. 5.

In order to open the charging or lock, resp. chamber 31 a cover 31a is in the position illustrated in FIG. 8 by broken lines.

Accordingly, a planar substrate 40, such as for instance a wafer plate or a lens 40 can be placed by a rotating mechanism 36 into or onto a support 33 in a recess 32. After the placing of the substrate 40 the upper cover 31a is moved into the position illustrated by full lines and thereafter the hydraulically or pneumatically, resp. activatable seals 35 are activated, wherewith the lock gate 38 is closed off in a sealed manner against the atmosphere. The lock chamber 38 is evacuated through a bottom opening 22 and vacuum means 24. After the evacuating operation in the lock chamber 38 has been completed the transporting mechanism 36 is now rotated by 90° or 180°, resp. around the central axis 36a. It is rotated by 90° if a treatment chamber is at this position, and by 180° if, such as shown in FIG. 8, only one treatment chamber 39 is present in the vacuum apparatus 31. Now, the substrate 40 in the treatment chamber 39 can be coated by a treatment device located in the treatment space 37a, for instance by a sputtering device. At the opposite side the treatment chamber 39 includes also an evacuating device 24 such to keep the treatment space 37a at a high vacuum. Depending from the design of the vacuum treatment plant 31 it is also possible to have pneumatically or hydraulically activatable seals placed in the treatment chamber 39, whereby, however, in case of only one single treatment chamber 39 an arranging of these seals is not necessary. After the treatment process in the chamber 39 has been terminated, the transporting device 36 is again rotated by 180° whereafter the substrate 40 can again be removed from the lock gate 38.

Figure 9:
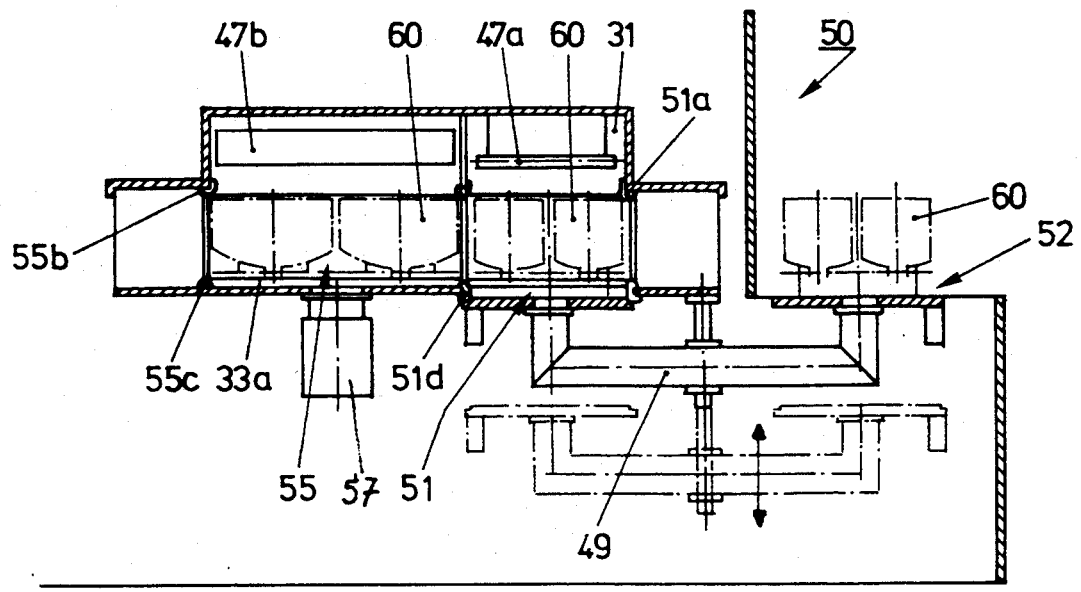
FIG. 9 illustrates a further embodiment of an inventive vacuum treatment plant having a plurality of treatment chambers, a main chamber and a charging and discharging lock for the feeding and removing of the substrates into and out of the apparatus.
Figure 10:
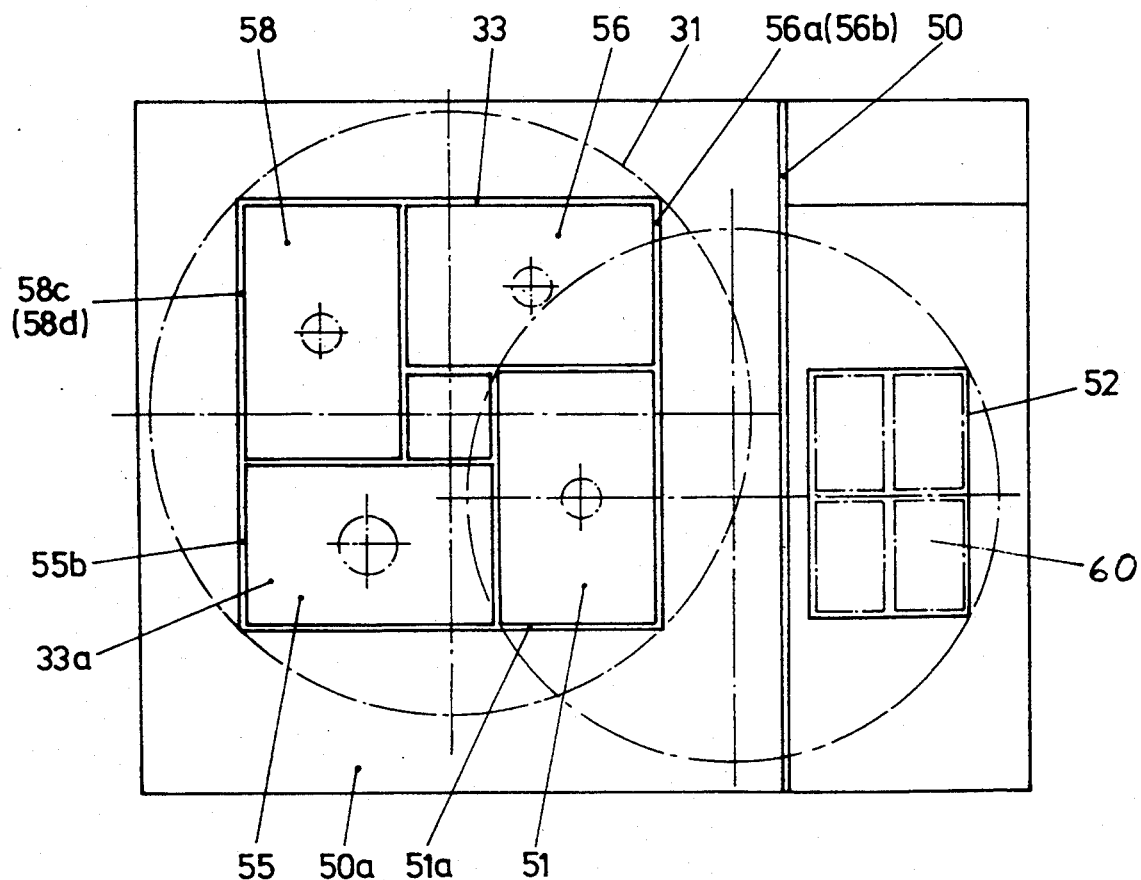
FIG. 10 illustrates the apparatus of FIG. 8, seen in section from above.

An apparatus for a conducting of a plurality of treatment processes is illustrated in FIGS. 9 and 10. It can be for instance be an apparatus for placing a corrosion proof reflecting layer onto headlights of automotive vehicles. The treatment steps which for instance are needed hereto are:

Charging the headlights in, to the vacuum coating apparatus, pre-treatment, metallising, depositing a protective layer and a final treatment.

The vacuum environment in all these treatment or processing steps differs considerably, such that a strict separation of the different process areas is needed.

The corresponding apparatus is illustrated in FIG. 9 in a lateral cross-section arrangement and in FIG. 10 in section seen from above.

The substrates 60 to be treated, these can be for instance headlights of automotive vehicles, are lowered from an initial or starting position by a transporting mechanism downwards and charged into the apparatus 50. By the subsequent rotational movement the substrates 60 are rotated by 180° to under the position 51 and by a subsequent upwards movement of the transporting device 49 charged into the main chamber 31 proper of the vacuum treatment apparatus. By an operating of the seals 51a and 51d a first treatment chamber or lock chamber is produced at the position 51 which can be separately evacuated, in which, if present, by means of a treatment unit 47a a first treatment process such as mentioned above is made at the headlights. Position 51 can, however, also be a pure lock chamber for charging or removing the substrates.

After the termination of this first treatment process in the position 51 the seals 51a and 51d are relieved and the four headlights being treated are rotated on a common support by 90°, for instance counterclockwise, whereafter, analogue to the position 56, a further treatment process may be made at the headlights. After a anewed rotation of 90° a further treatment is made in position 58.

In FIG. 9, finally, the headlights can be recognized in the position 55, where by means of seals 55b and 55c again a completely sealed separating of this treatment chamber 55 is possible. By means of a treatment unit 47b, again a further treatment process is made at the headlights.

When now the headlights are processed completely they are rotated back into the original position 51 and transported by the transporting mechanism 49 by a lowering, rotating about 180° and anewed lifting into the position 52 out of the apparatus. In the practical operation the illustrated positions 51, 56, 58 and 55 are operated together in a timed fashion, whereby specifically by a simultaneous operating of the light seals 51a, d; 56a, b; 58c, d and 55b, c the sealing of all chambers is made. Now the finally treated headlights 60 can be removed from the support to be either forwarded to a subsequent treatment or, however, to be assembled for instance into an automobile. For certain operations, such as for instance maintenance work, it is also possible to individually treat or alrate in a simple way only area portions of the apparatus by a corresponding operating of the seals.

The illustrations of FIGS. 9 and 10 are quite obviously simplified schematic illustrations and no details which are known as such are shown, such as the placing of vacuum pumps, the mounting of infeed and discharge conduits of the pneumatic or hydraulic, resp. medium, etc., such to render the illustration more clearly. It is rather the matter of explaining the decisive inventive idea based on a concrete practical example. Also, the recipient areas for the substrates shown here as chambers can be designed for sufficiently planar substrates analogue to the apparatus of FIG. 8 in form of a plate with recesses for a placing of the substrates hereinto.

In the arrangements illustrated in FIGS. 2 to 10 it is possible to conduct any kind of coating or treating, resp. processes at substrates or workpieces. The inventive idea is specifically suitable for the practicing of CVD-processes, PVD-processes, etc., —in short, for all such surface treatment processes or etching or coating processes, resp. where the operation must proceed at vacuum or high vacuum resp. conditions.

A further advantage of the idea defined in accordance with the invention is that the substrate or a workpiece, resp. can be treated only at an area portion thereof by means of a vacuum treatment process without having to charge the entire workpiece into a corresponding treatment chamber. This advantageous aspect of the invention will now be entered into more in detail with reference to FIGS. 11 and 12.

Figure 11:
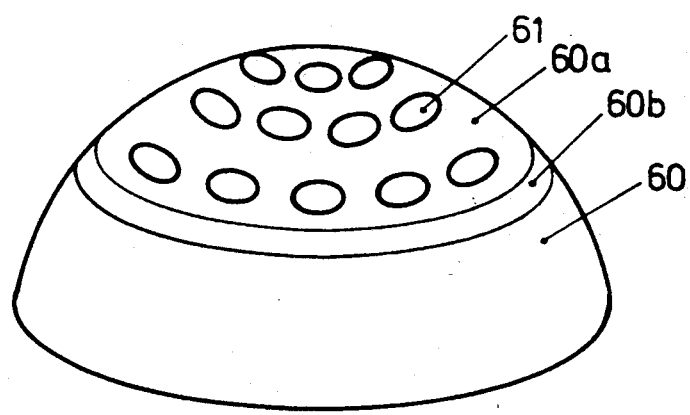
FIGS. 11 and 12 illustrate schematically the sealingly separated treating of an area portion of a part of a substrate or a part of a support.

FIG. 11 illustrates perspectively a workpiece having a spherical surface on which point like areas are to be coated or treated, resp. The workpiece, identified by the reference numeral 60 is to be treated only at the area portion 60a which is separated from the rest of the workpiece by the boundary 60b, and specifically in that point shaped coatings 61 shall have to be applied.

Figure 12:
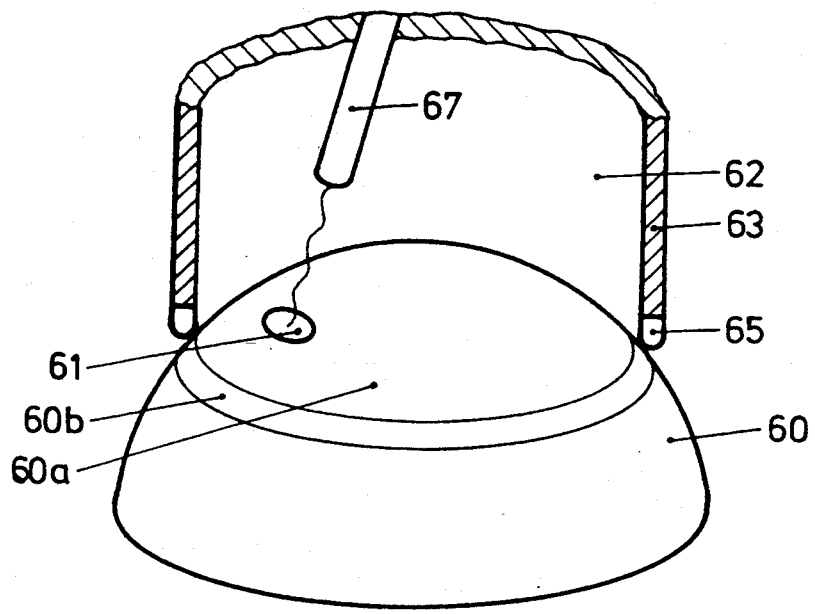

Such as now can be recognized in FIG. 12 the workpiece 60 is guided towards a treatment chamber 62, bordered by chamber walls 63. The workpiece is thereby led to the lower contours of the walls 63, at which an annular, pneumatically or hydraulically activatable seal 63 is arranged. This seal contacts the workpiece 60 along the imaginary line 60b. Prior to the conducting of the treatment process within the area 60a of the workpiece the annular seal 65 is now activated, wherewith the area portion 60a is closed off in a sealed manner against the environment, wherewith the treatment chamber 62 can be evacuated.

Finally, the spot-like treatment can be made by a treatment apparatus 67 in that spot shaped coatings 61 are produced.

The advantage of this method is specifically that especially in case of large workpieces the expenditure regarding the apparatus remains low and short treatment times are possible. Also, various surface shapes can be covered by the seal. The contact pressure and the relatively large distance or measure, resp. of the expansion of the seal 65 causes a certain equalizing at not planar areas, wherewith a sealed separating also of difficult workpieces is made possible. The advantage of the inventive method is obviously also true for all apparatuses described with reference to FIGS. 2 to 10.

Figure 13:
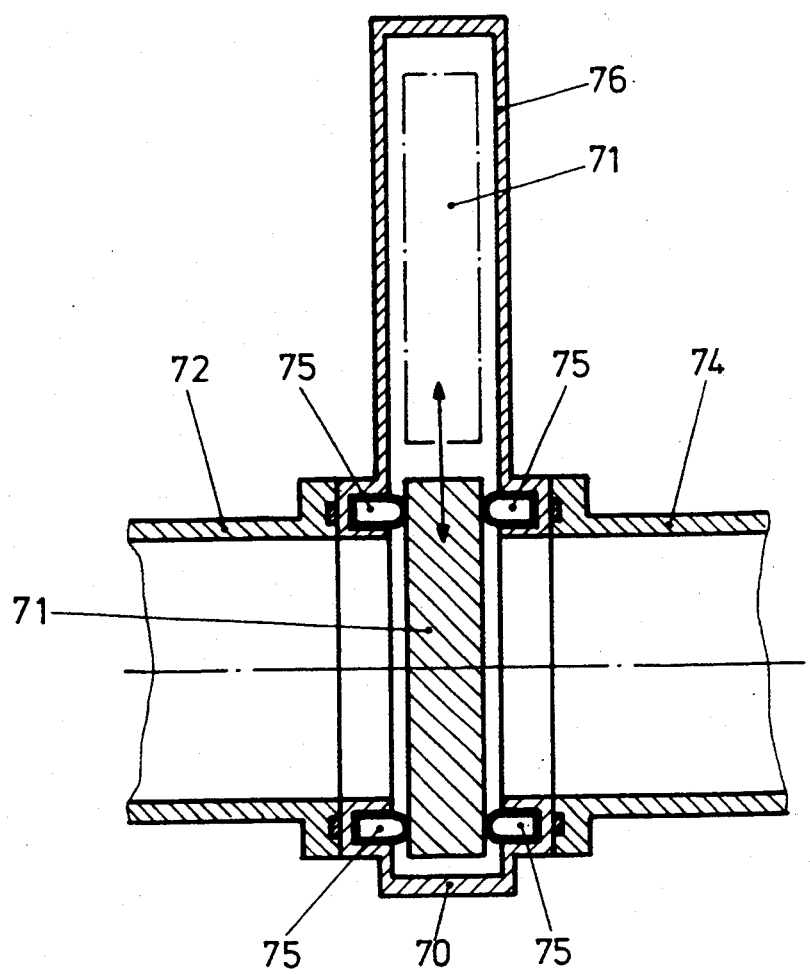
FIG. 13 is a sectional view of an embodiment of an inventive valve, for the sealed closing off of a passage opening.

FIG. 13 illustrates a valve 70 designed in accordance with the invention and which is foreseen for a closing of the connecting passage between the two pipe connections 72 and 74. A gate or plate shaped member 71 is moved for a closing or opening of mentioned passage between the closed position illustrated by full lines and the position illustrated by broken lines. For the retracting of the plate or gate shaped member 71 a chamber like projection 76 is arranged at the valve 70. In order to close the valve the gate or plate shaped member 71 moves into the open passage between the two pipes 72 and 74, whereby the moving from the position designed by broken lines into the position designed by full lines can be carried out because the pneumatically or hydraulically activatable seals 75 are deactivated and accordingly retracted and, therefore, no lateral friction occurs at the member 71. As soon as the member 71 closes the passage between the two pipe connections 72 and 74 completely off, the seals are activated for a sealed closing of the seals 75. The advantage of the valve illustrated in FIG. 13 is at the one side that the valve member 71 must be moved in only one direction and accordingly a pressing on movement or a pressing on unit, resp. is not needed, and additionally that the moving from the open into the closed position of the member 71 can proceed at a small expenditure of force because no friction whatsoever occurs during the moving of the valve member 71. The valve illustrated in FIG. 13 can at the one side be used in all earlier illustrated vacuum treatment apparatuses, can, however, be basically used universally, i.e. also for a separating or shutting off, resp. of liquid conduits, gas conduits at atmospheric pressure, etc.

Figure 14:
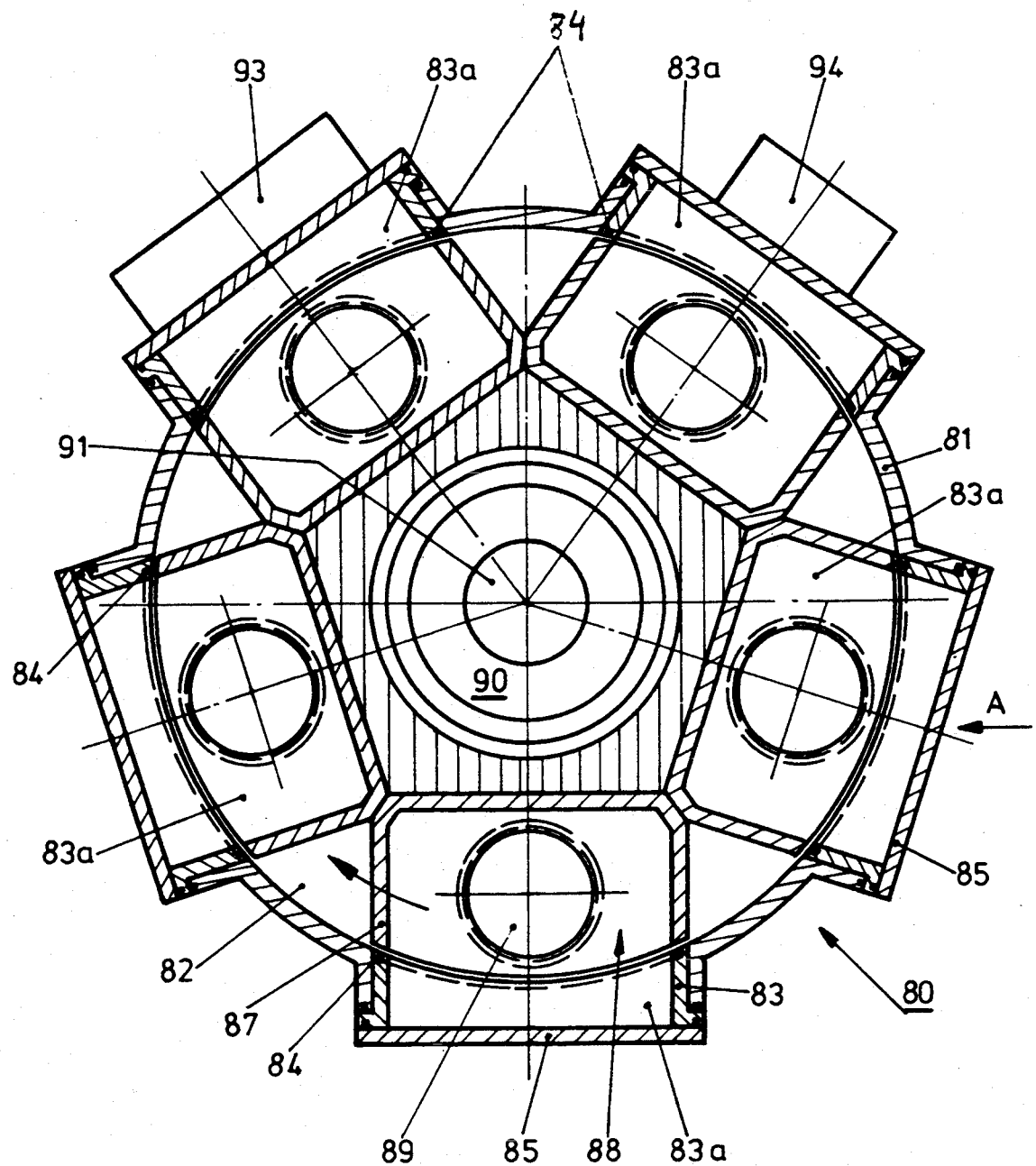
FIGS. 14–16 illustrate a further embodiment of an inventive treatment plant.
Figure 15:
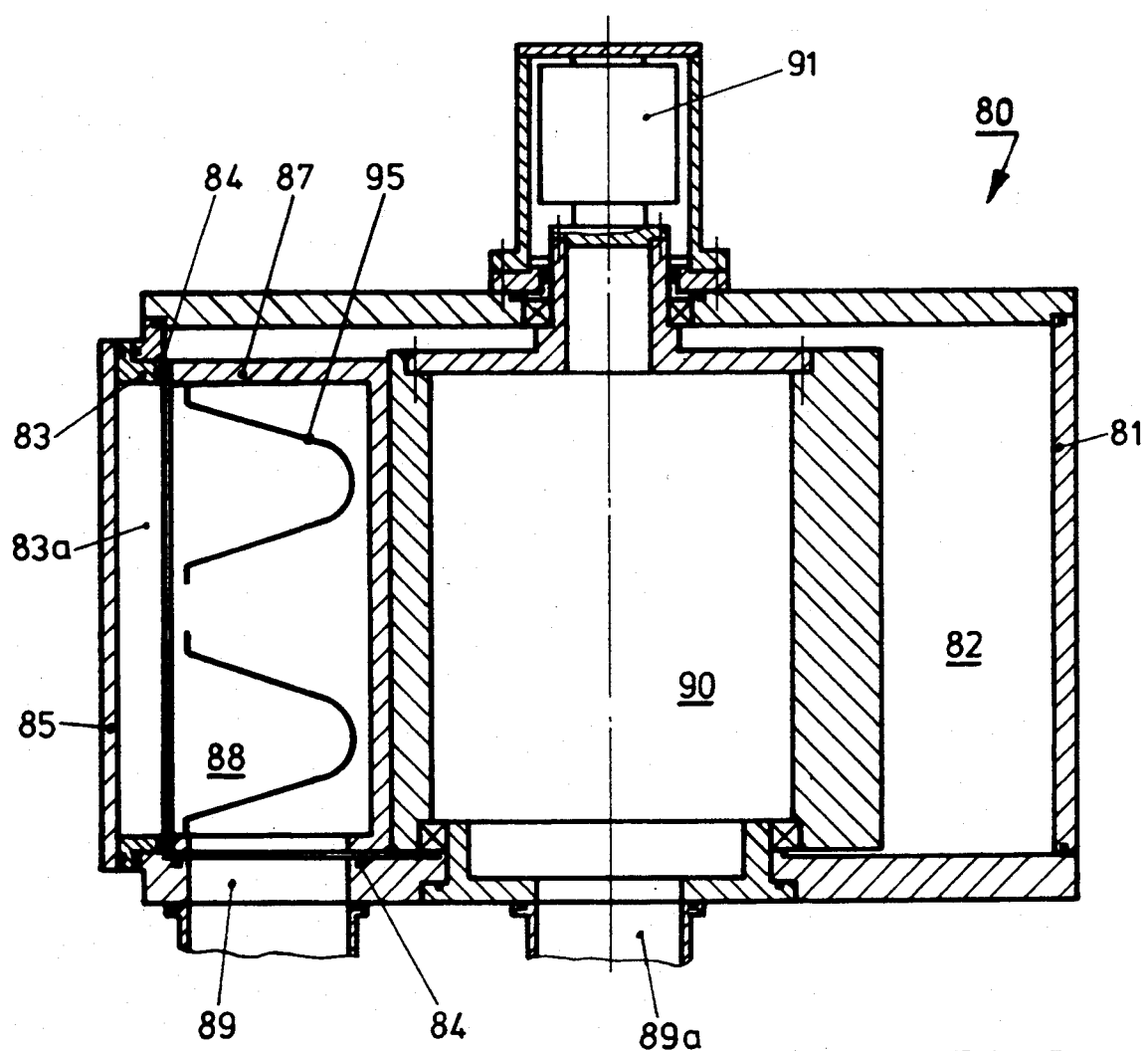
Figure 16:
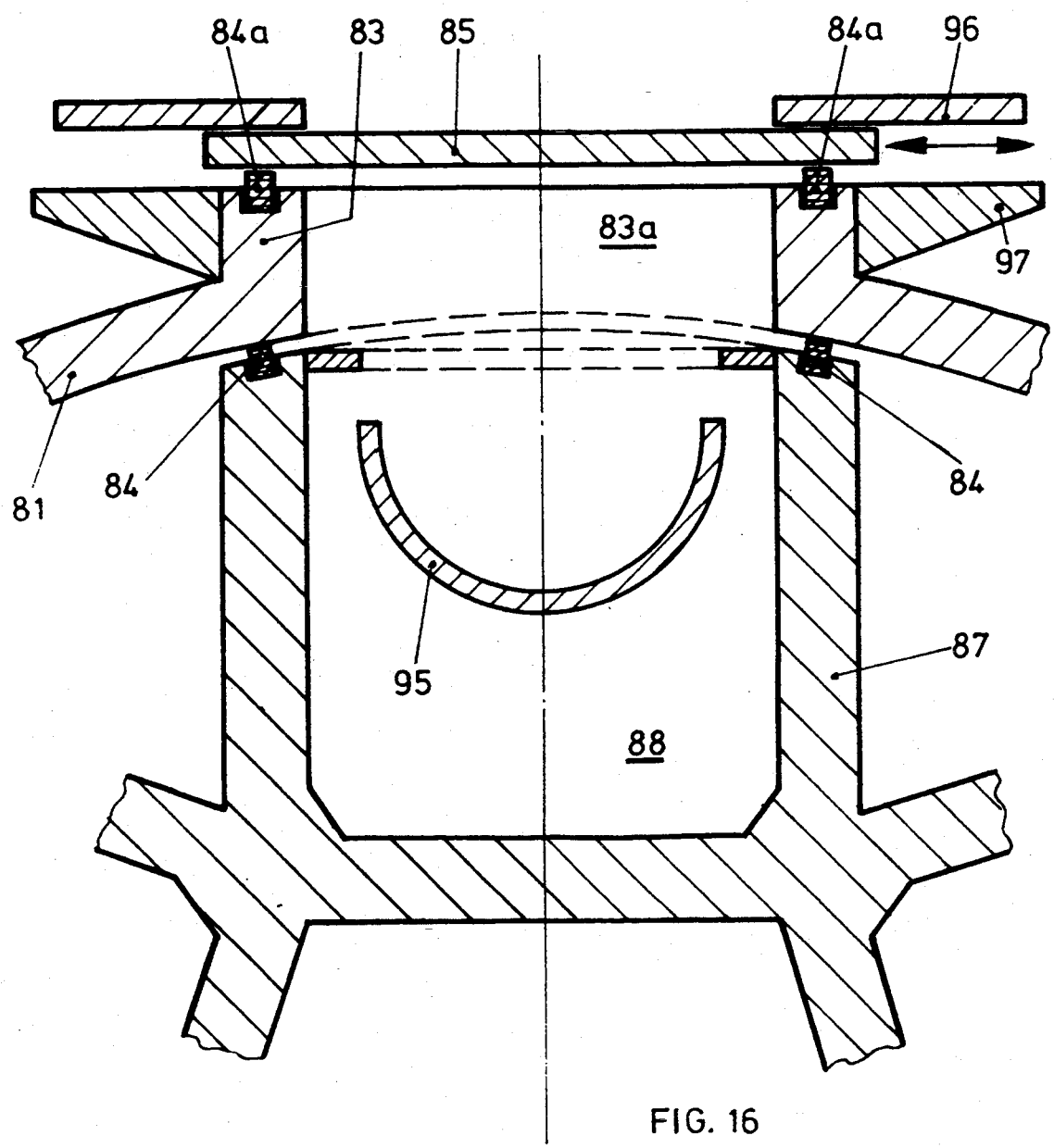

FIGS. 14 to 16 illustrate a further preferred embodiment of the inventive treating apparatus, FIG. 14 illustrates thereby the apparatus in section seen from above, FIG. 15 the apparatus in section seen from the side and FIG. 16 a cut-out of FIG. 14, illustrating a single treatment chamber or lock arrangement, resp.

The treatment apparatus is of a cylindrical shape and includes an outer stationary cylinder jacket wall and an inner part 82 which is rotatable around the axis, including the individual chambers 88 for the placing of the substrates to be treated, such as for instance of reflectors 95, such as can be seen in FIG. 14 five such chambers are present and which they formed by respective walls 87. These chambers are arranged star-like or peripherically along the cylinder wall 81 whereby their openings are formed facing outwards. The openings of the chambers are directed at the respective treatment positions towards corresponding treatment chambers 83a which are formed at the one side by lateral walls 83 and at the lock position by a peripherically outwards directed removable cover 85, whereby the walls of the chambers and of the treatments chambers correspond to each other in such a manner, that they fit exactly onto each other at the respective treatment positions. In the treatment position the treatment chambers 83 can be provided for instance with a treatment unit 93, 94, such as for instance sputtering sources and/or etching devices. Optionally, the apparatus can include in accordance with respective demands a corresponding number of treatment devices. If individual chambers are not needed, they can be covered by stationary flanged covers 85. In order to allow a treatment of the substrate at the respective positions and to ensure the thereto necessary sealing of the treatment chamber against the outside, hydraulically or pneumatically activatable seals 84 are foreseen additionally, which during the rotation of the process chamber recipients are in a retracted state and during the treatment process in an activated, pivoted state. In order to treat a substrate such as for instance a reflector 95 the cover 85, for instance at the position A, of a stationary arranged treatment chamber is removed and the substrate is inserted into the corresponding chamber at the position A. Thereafter, the cover 85 is mounted in a sealed manner and the chamber is evacuated thereafter in order to remove the air which entered the process chamber during the charging of the substrate. This can be made for instance through pumping off stubs 89 located at the bottom of the cylinder shaped treatment apparatus. Now, the seals 84 in the entire apparatus is deactivated and the inner rotatable part 82 is rotated for instance clockwise so long until each process chamber reached the subsequent station. Thereafter, the activatable seals 84 are again activated and the individual process chambers are evacuated at the treatment stations via the pumping off stubs 89. The rotating of the inner rotatable part 82 of the cylinder proceeds for instance by a motor 91.

At the various treatment stations the units 93, 94 needed for the treatment may be either located within the treatment chamber 83a or are flanged onto the treatment chamber 83a. In order to also render the entire apparatus itself evacuatable, a further pumping off stub 89a is, furthermore, arranged at the center via which the center space 90 of the cylinder is also evacuated.

FIG. 16 illustrates a single chamber according to the illustration of FIG. 14, whereby the cover 85 of a processing chamber 83a is shown as special embodiment as a lock device. For the charging and removing operation of the substrates the two outer activatable seals 84a can be deactivated and the gate like designed cover 85 can be moved in the guides 96 and 97, resp. in the direction of the arrow. As soon as the operation has ended the cover 85 is again moved into the illustrated position, and the two outer activatable seals 84a are again activated, whereafter the treatment chamber 88 is closed off in a sealed manner against the outside. Obviously, there are here not two single seals 84a, but rather an annular closed seal which ensures a at all sides sealing connection between the treatment chamber wall 83 and the cover 85.

The apparatus which is illustrated in FIGS. 14 to 16 can obviously also be operated inversly in that the centrally located chambers are stationary and the cylinder jacket wall is rotated relative around the central stationary positioned arrangement. Additionally, obviously also generally known gate arrangements with known valve arrangements without any pneumatically active seals can be used.

The vacuum treatment apparatuses or parts or cut-outs thereof illustrated in FIGS. 1 to 16 are obviously examples only which are intended for a closer explanation of the invention. Correspondingly, the illustrated apparatuses can be modified, completed or enlarged in any possible way in case such is necessary or senseful. Hereto, it is specifically to be noted that all documents listed as prior art, i.e. the apparatuses suggested in the documents can be modified or altered, resp. in the sense of the present invention in that the respective sealing of parts of the apparatus or treatment chambers can be made by means of the inventively claimed pneumatically or hydraulically activatable seals.

While there are shown and described present preferred embodiments of the invention it is to be distinctly understood that the invention is not limited thereto, but may be otherwise variously embodied and practiced within the scope of the following claims.

We claim:

1. A vacuum treatment apparatus for a surface treatment of substrates or workpieces, comprising:
at least one transport mechanism for at least one of incorporation, removal and transporting the substrates or workpieces into, out of and through the apparatus;

at least one pneumatically or hydraulically expandable seal for sealing the apparatus and/or parts thereof; and means for pneumatically or hydraulically expanding the seal so that the sealing effect takes place between the apparatus and the mechanism or between parts of the apparatus and the mechanism.

2. The vacuum treatment apparatus of claim 1, in which said seal has a shape of a hose, bellow, balloon or membrane with a surface adapted to be increased in an expandable manner by introducing a gas or a liquid into a core in an inner space or onto a side surface of the seal, in order to tightly seal or separate, the apparatus or parts thereof.

3. The vacuum treatment apparatus of claim 1, in which the seal consists of an expandable material selected from the group of a natural or synthetic material, an expandable or plastics material or an elastomeric material.

4. The vacuum treatment plant of claim 1, in which the seal is made of one of the group of the following materials:

Butadiene-Polymeride, a Butadienne-Styrene Copolymer, Silicon, Polyurethane, an Elastomeric, a Fluorelastomeric, an elastic thermoplastic material, Polyurethane or elastomeric Polyamide.

5. The vacuum treatment plant of claim 1, in which the seal is designed in a bellows-like manner, including a substantially metal bellows which is covered at one end at least partially by an elastic sealing material.

6. The vacuum treatment apparatus of claim 1, comprising at least one chamber, each chamber adapted to be closed off or separated, by the pneumatically or hydraulically expandable seal.

7. The vacuum treatment apparatus of claim 1, for a surface treatment of substrates or workpieces, including at least one valve with a sealing contour for a sealing of the apparatus or of areas thereof, the at least one pneumatically or hydraulically expandable seal arranged at the valve and along the sealing contour.

8. The vacuum treatment apparatus of claim 1, comprising at least one outer and at least one inner apparatus area, the pneumatically or hydraulically expandable seal separating, in a sealed manner the outer and inner apparatus area.

9. The vacuum treatment apparatus of claim 1, comprising a main chamber or distribution chamber, within which the substrates or workpieces, which are to be coated are transported by means of the transport mechanism between at least two treatment chambers or between a lock chamber and at least one treatment chamber, whereby a part of or all of the treatment chambers or the lock chamber, are seperable in a sealed manner by means of hydraulically or pneumatically expandable seals against the main chamber or distribution chamber.

10. The vacuum treatment apparatus of claim 8, in which the apparatus is of a cylindrical shape, and in which at least one recipient chamber or container, for the receipt of the substrates to be treated is arranged along a peripheral wall of a circular or cylindrical distribution chamber having chambers directed periherically towards the outside and which are directed at the respective treatment positions towards the corresponding treatment stations located in the peripheral wall of the cylinder in order to form the treatment or process chambers, which recipient chambers or containers, or the peripheral wall of the cylinder are arranged to be rotatable around the center axis of the cylinder, such that the recipient chambers or containers, are movable relative to the peripheral wall of the cylinder in order to be moved from one treatment station to the next one, whereby pneumatically or hydraulically expandable seals are at a part or at all of the recipient chambers or containers, in order to sealingly separate the treatment or process chambers during a treatment operation.

11. The vacuum treatment apparatus of claim 8, in which individual chambers are separable from the outer area of the apparatus or a main chamber or from each other by means of valves having a gate-, plate- or disk-like member, whereby the sealed separating proceeds by pneumatically or hydraulically expandable seals at the area of a sealing contour of the gate-, plate- or disk-like member of the valve in its closed position.

12. The vacuum treatment apparatus of claim 1 and for the treatment of disk shaped or planar, articles, comprising one or a plurality of planar transporting supports or transporting plates in order to move the articles between at least two treatment stations or a lock chamber, and at least one treatment chamber, whereby hydraulically or pneumatically expandable seals are located at the area of a part or of all stations and are expandable in a directions against the respective transporting support, of which the distance of the expansion or stroke is selected in such a manner that in the retracted state the disk-like articles and the respective transporting supports may be freely moved into and out of the treatment station, whereby however, a sealed separating of the respective station by means of the seals contacting directly in a sealed manner the transporting support or transporting plate is ensured during the execution of the treatment operation inside the station.

13. The vacuum treatment apparatus of claim 1, including at least one treatment station and at least one chamber-like container open on at least one side for receipt of substrates or workpieces to be displaced by the transport mechanism, between the station and the container, and comprising the pneumatically or hydraulically expandable seal being at the station in order to tightly seal the chamber-like container at a respective position at the station for conducting a treatment process.

14. A vacuum treatment apparatus comprising:
means defining a volume for receiving a member to be surface treated under vacuum conditions in the volume;
a structure movable with respect to the means defining the volume;
an expandable seal operatively engaged between the structure and the means defining the volume for sealing the volume; and
means for supplying a fluid to the seal for expanding the seal.

15. An apparatus according to claim 14, wherein the means defining a volume includes a wall, the structure movable with respect to the means defining the volume comprising a partition, the seal being mounted to one of the wall and partition for engaging against the other of the wall and partition when the seal expands.

16. An apparatus according to claim 14, wherein the seal comprises an elastic wall surrounding a hollow core, the means for supplying fluid comprising a conduit communicating with the hollow core for supplying one of hydraulic and pneumatic fluid to the hollow core.

17. An apparatus according to claim 14, wherein the means defining a volume comprises a plurality of stations, the structure comprising at least one chamber having a sealing contour and movable among the chambers, the seal being mounted for expanding at the sealing contour.

18. An apparatus according to claim 14, wherein the means defining a volume comprises a plurality of stations, the structure comprising a holder for holding a plurality of members and mounted for movement of the members among the stations, the seal being mounted for expanding against each holder in at least one of the stations.

19. An apparatus according to claim 14, wherein said structure comprises a surface defining the member to be surface treated, the means defining a volume comprising an enclosure element having a contour edge and movable against the surface for closing a volume, the seal being mounted for expanding between the contour edge of the enclosure element and the surface of the structure.

20. An apparatus according to claim 14, wherein the means defining a volume comprises a passage, the structure comprising a member for closing off the passage, the seal being expandable between the member and the passage for sealing the passage.

21. A vacuum treatment apparatus for a surface treatment of substrates or workpieces, comprising:
   a valve for a sealed separating of a through passage opening of the vacuum treatment apparatus or for a sealed separating of two chambers which communicate via a passage in the vacuum treatment apparatus, the valve having a valve member In the passage opening or in the passage;
   at least one pneumatically or hydraulically expandable seal for sealed closing of the passage opening or of the passage that forms the communication between said two chambers; and
   means for expanding the expandable seal between the valve member and the passage opening or passage.

22. The vacuum treatment apparatus of claim 21, in which said valve member comprises a gate-, plate- or disk-like member and the at least one hydraulically or pneumatically expandable seal along the closing contour of the gate-, plate- or disk-like member in its closed state, as well.

23. A method of treating substrates or workpieces by means of PVD, CVD, etching processes, thermal processes and/or plasma processes, wherein the treating is made by means of the apparatus according to claim 1.

24. A method for a sealed closing or separating, of a vacuum treatment apparatus for a surface treating of substrates or workpieces, wherein one or a plurality of hydraulically or pneumatically activatable seals or membranes, are activated in such a manner by an introducing of gas or of liquid into the inside or and core of the seal or onto a sidewall of the membrane, so that their surface is increased in such a manner that communicating openings between the inside space of the apparatus or area portions thereof and the respective environment thereof are closed in a sealed manner.

25. The method of claim 24, wherein valves having a plate-, gate-, or disk-like member are for the closing and reopening of the apparatus or area portions thereof or of treatment stations and/or a lock chamber, whereby for a sealed closing the respective plate-, gate- or disk-like member of the valve is closed and thereafter a hydraulically or pneumatically activatable seal at the valve located along a closing contour of the member is operated in such a manner that due to the activated seals contacting the contour in a sealed manner a completely sealed closing off or a sealed separation, is produced.

26. A method for a sealed closing or separating of at least one treatment station and/or of a lock chamber in a vacuum treatment plant for a conducting of separate treatment processes on substrates or workpieces, wherein hydraulically or pneumatically activatable seals are at at least a part of the respective stations or the chamber, which seals are activated during the conducting of the processes in order to seal off the respective station or chamber, and which seals are deactivated or retracted, in order to allow a moving of the substrates or workpieces, between the stations and/or the chamber and one station.

27. A method for a sealed separating or closing of a portion of the surface of a substrate to be treated for the execution of a treatment process at said portion of the surface, wherein the substrate or workpiece is led in such a manner into or onto a treatment chamber, that the portion of the surface to be treated contacts a wall of the treatment chamber, whereby the portion of the substrate or workpiece, to be treated is separated in a sealed manner by means of one or a plurality of hydraulically or pneumatically activatable seals at wall of the chamber, such that the treatment chamber can be closed in a sealed manner and a treatment process can be conducted at a area of the surface of the substrate.

* * * * *